US011088242B2

United States Patent
Matsuda et al.

(10) Patent No.: US 11,088,242 B2
(45) Date of Patent: Aug. 10, 2021

(54) CRYSTAL, CRYSTALLINE OXIDE SEMICONDUCTOR, SEMICONDUCTOR FILM CONTAINING CRYSTALLINE OXIDE SEMICONDUCTOR, SEMICONDUCTOR DEVICE INCLUDING CRYSTAL AND/OR SEMICONDUCTOR FILM AND SYSTEM INCLUDING SEMICONDUCTOR DEVICE

(71) Applicant: FLOSFIA INC., Kyoto (JP)

(72) Inventors: Tokiyoshi Matsuda, Kyoto (JP); Takahiro Sasaki, Kyoto (JP); Toshimi Hitora, Kyoto (JP); Isao Takahashi, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/981,550

(22) PCT Filed: Mar. 30, 2020

(86) PCT No.: PCT/JP2020/014693
§ 371 (c)(1),
(2) Date: Sep. 16, 2020

(87) PCT Pub. No.: WO2020/204006
PCT Pub. Date: Oct. 8, 2020

(65) Prior Publication Data
US 2021/0143251 A1 May 13, 2021

(30) Foreign Application Priority Data
Mar. 29, 2019 (JP) .............................. JP2019-068480

(51) Int. Cl.
*C30B 29/22* (2006.01)
*H01L 29/04* (2006.01)
(Continued)

(52) U.S. Cl.
CPC .............. *H01L 29/04* (2013.01); *C30B 29/22* (2013.01); *H01L 21/0262* (2013.01);
(Continued)

(58) Field of Classification Search
CPC .............. H01L 29/04; H01L 21/02565; H01L 21/02598; H01L 29/24; H01L 21/0262;
(Continued)

(56) References Cited

U.S. PATENT DOCUMENTS 9,505,936 B1 * 11/2016 Crawford ................. C09D 7/48
9,711,590 B2 * 7/2017 Kaneko ............. H01L 21/02488
(Continued)

FOREIGN PATENT DOCUMENTS

| CN | 105670622 | 6/2016 |
| CN | 107652973 | 2/2018 |

(Continued)

OTHER PUBLICATIONS

Written Opinion of the International Searching Authority dated Jun. 16, 2020 in International (PCT) Application No. PCT/JP2020/014693 with English translation.
(Continued)

*Primary Examiner* — Jaehwan Oh
(74) *Attorney, Agent, or Firm* — Wenderoth, Lind & Ponack, L.L.P.

(57) ABSTRACT

As an aspect of an embodiment, a crystal contains a metal oxide containing Ga and Mn and having a corundum structure.

21 Claims, 12 Drawing Sheets

(51) Int. Cl.
*H01L 29/24* (2006.01)
*H01L 21/02* (2006.01)
*H01C 7/04* (2006.01)
*H01L 29/872* (2006.01)
*H01L 29/78* (2006.01)
*H01C 7/02* (2006.01)

(52) U.S. Cl.
CPC .. *H01L 21/02565* (2013.01); *H01L 21/02598* (2013.01); *H01L 29/24* (2013.01); *H01C 7/02* (2013.01); *H01C 7/04* (2013.01); *H01L 21/0242* (2013.01); *H01L 29/78* (2013.01); *H01L 29/872* (2013.01)

(58) Field of Classification Search
CPC ... H01L 21/0242; H01L 29/872; H01L 29/78; C30B 29/22; H01C 7/02; H01C 7/04
See application file for complete search history.

(56) References Cited

U.S. PATENT DOCUMENTS

| | | | |
|---|---|---|---|
| 2010/0259358 A1 | 10/2010 | Ryu et al. | |
| 2013/0245183 A1* | 9/2013 | Beaudry | B05D 7/14 |
| | | | 524/423 |
| 2013/0288042 A1* | 10/2013 | Haines | C04B 41/5072 |
| | | | 428/334 |
| 2015/0170805 A1 | 6/2015 | Ito et al. | |
| 2015/0325659 A1 | 11/2015 | Hitora et al. | |
| 2018/0097073 A1 | 4/2018 | Oda et al. | |
| 2019/0322123 A1* | 10/2019 | Hobbs | B05D 3/08 |
| 2020/0152805 A1 | 5/2020 | Sugimoto et al. | |
| 2021/0013035 A1 | 1/2021 | Fujita et al. | |

FOREIGN PATENT DOCUMENTS

| | | |
|---|---|---|
| JP | 2010-251757 | 11/2010 |
| JP | 5509393 | 6/2014 |
| JP | 2015-115438 | 6/2015 |
| JP | 2018-129500 | 8/2018 |
| JP | 6557899 | 8/2019 |
| WO | WO2013/035841 | 3/2013 |
| WO | WO2018/052097 | 3/2018 |
| WO | 2019/013136 | 1/2019 |

OTHER PUBLICATIONS

Huang, Rong et al., "Microstructure of Mn-doped γ-$Ga_2O_3$ epitaxial film on sapphire (0001) with room temperature ferromagnetism", Journal of Applied Physics, (2007), 101(6), pp. 063526-1-063526-6, issued Mar. 2007.

* cited by examiner

CRYSTAL, CRYSTALLINE OXIDE SEMICONDUCTOR, SEMICONDUCTOR FILM CONTAINING CRYSTALLINE OXIDE SEMICONDUCTOR, SEMICONDUCTOR DEVICE INCLUDING CRYSTAL AND/OR SEMICONDUCTOR FILM AND SYSTEM INCLUDING SEMICONDUCTOR DEVICE

TECHNICAL FIELD

The present invention relates to crystals useful for semiconductor devices such as thermistors and power devices, and also relates to crystalline oxide semiconductors useful for semiconductor devices such as power devices. Furthermore, the present invention relates to semiconductor devices including crystal(s) and/or crystalline oxide semiconductor(s). Also, the present invention relates to systems including semiconductor device(s).

BACKGROUND ART

As a switching device of the next generation achieving high withstand voltage, low losses, and high temperature resistance, semiconductor devices using gallium oxide ($Ga_2O_3$) with a wide band gap attract attention and are expected to be applied to power semiconductor devices including an inverter. Also, gallium oxide is expected to be applied to light emitting and receiving elements such as a light emitting diode (LED) and a sensor, since gallium oxide has a wide band gap. Such gallium oxide has a band gap that may be controlled by forming a mixed crystal with indium or aluminum singly or in combination and such mixed crystals are extremely attractive materials as InAlGaO-based semiconductors. Here, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5$ to $2.5$) and can be viewed as the same material system containing gallium oxide.

Various attempts have been made to enhance electrical properties including semiconductor properties in semiconductor devices that use wide-band-gap semiconductor material(s). For example, in Patent Literature (PTL) 4, in the production of β-$Ga_2O_3$ based semiconductor element using the MBE method, doping is performed by ion implantation, and silicon is described as an example of an n-type dopant. However, when doping is performed by ion implantation, there has been a problem that it cannot be used as a donor unless an annealing treatment at a high temperature (e.g., 1000° C.) is performed after the ion implantation. Also, in the method described in PTL 1, even if an annealing treatment for activation was performed, for example, when silicon was used as a dopant, there were many crystalline defects, also poor electrical properties, and for example, it was difficult to obtain an electron mobility that is 1 $cm^2$/Vs or more.

Various attempts have been made to enhance electrical properties including semiconductor properties in semiconductor devices that use wide-band-gap semiconductor material(s). For example, in Patent Literature (PTL) 4, in the production of β-$Ga_2O_3$ based semiconductor element using the MBE method, doping is performed by ion implantation, and silicon is described as an example of an n-type dopant. However, when doping is performed in a film by ion implantation, there has been a problem that it cannot be used as a donor unless an annealing treatment at a high temperature (e.g., 1000° C.) is performed after the ion implantation. Also, in the method described in PTL 4, even if an annealing treatment for activation was performed, for example, when silicon was used as a dopant, there were many crystalline defects, also poor electrical properties, and for example, it was difficult to obtain an electron mobility that is 1 $cm^2$/Vs or more. In addition, in PTL 5 by the present applicant, it is described that a crystalline oxide semiconductor film containing as a major component a corundum-structured oxide semiconductor further contains germanium, silicon, titanium, zirconium, vanadium, or niobium was superior in electric properties compared with a crystalline oxide semiconductor film containing tin as a dopant. Further in order to enhance electrical properties of crystals and crystalline oxide semiconductor films, various studies have been promoted (e.g., PTL 6).

Further, conventionally, in a system including an electronic device or a product such as an electronic device, a temperature sensor or a gas sensor is used to compensate the temperature of the electronic device, and for the temperature sensor or a gas sensor, a thermistor is used as a semiconductor device. Examples of the thermistor include a negative temperature coefficient (NTC) thermistor and a positive temperature coefficient (PTC) thermistor.

The negative temperature coefficient (NTC) thermistor is a thermistor utilizing a phenomenon that resistance decreases as temperature rises, has a strong tendency of an n-type semiconductor property, in which the resistance exponentially decreases in a wide range of temperature, and is applicable to most thermistors. The positive temperature coefficient (PTC) thermistor is a special thermistor utilizing a phenomenon that the resistance increases abruptly when the temperature rises and exceeds a constant temperature.

In recent years, miniaturization and thinning of electronic devices have been progressed, and there is also demand for miniaturization and thinning of temperature sensors and gas sensors used in the electronic devices and also thermistor elements used for such sensors. For such a demand, thermistor elements using thermistor films have been investigated but not yet satisfactory due to weak mechanical strength and/or insufficient thermistor characteristics.

In PTL 1, an NTC thermistor film formed by a method of powder injection in a vacuum at room temperature is described. However, the NTC thermistor film described in the PTL 1 is still weak in mechanical strength, and is difficult to be thinned, and also has a problem requiring a complicated process using a vacuum device.

In addition, PTL 2 describes a thermistor film formed by an aerosol deposition method. However, if a thermistor film is attempted to be obtained by an aerosol deposition method, a film with densely disposed particles superior in thermistor properties is unable to be obtained without aerosol of thermistor raw-material particles being injected through a small-diameter nozzle to be collided on a substrate. Also, to obtain such a film, it is still difficult to increase the area of the film. Even if film-formation time was extended longer, adhesiveness and surface smoothness were still poor and there were problems that thermistor properties of thermistor films formed by the method described in the PTL 2 were insufficient if the thermistor films do not have thickness of several microns or more, or still insufficient as thermistor films.

As described above, conventionally, even in an attempt to obtain a thermistor film, when thermistor raw-material particles were simply deposited, mechanical strength of the film was still weak, and thermistor properties were insufficient. Also, even when thermistor raw-material particles were blown onto the substrate to form a dense film, sufficient thermistor properties were not obtained if the film was not formed to have thickness of several microns or more. Even with the film having such a film thickness, there were still problems that adhesiveness and surface smoothness were poor.

Furthermore, PTL 3 describes a thin-film thermistor element, however, with the thin-film thermistor element described in PTL 3, there are problems that adhesion to the thermistor film was not ensured if a certain amount of oxygen and nitrogen were not contained in the electrode, and also vertical thermistor elements were difficult to be realized.

CITATION LIST

Patent Literature

PTL 1: JP2010-251757A
PTL 2: JP2015-115438A
PTL 3: JP5509393B
PTL 4: WO2013/035841A
PTL 5: JP6557899B
PTL 6: WO2018/052097A

SUMMARY OF INVENTION

Technical Problem

As a first aspect of the present invention, an object is to provide a crystal enhanced in crystal quality. As a second aspect, an object is to provide a crystalline oxide semiconductor enhanced in semiconductor properties. Further, as a third aspect, an object is to provide a semiconductor device enhanced in semiconductor properties. Further, as an aspect of the invention, an object is to provide a thermistor film as a semiconductor film with thermistor properties, and/or a semiconductor device including the thermistor film.

Solution to Problem

The present inventors, using a mist CVD method under certain conditions, successfully obtained a corundum-structured crystal containing Ga and Mn, and further intensive studies were made and successfully obtained a corundum-structured semiconductor containing Ga and Mn grown under certain conditions by the mist CVD method, and found that crystalline oxide semiconductors obtained as mentioned above are enhanced in electrical properties and solve the conventional problem. Also, the present inventors continued studies to achieve at least one of the mentioned objects, it is found that a film of corundum-structured crystalline oxide semiconductor containing Ga and Mn and formed by the mist CVD method under certain conditions is able to realize thermistor property with enhanced sensitivity at 200° C. to 250° C.

Further, after obtaining the above findings, the present inventors have further studied to complete the present invention.

[1] A crystal includes a metal oxide containing Ga and Mn and having a corundum structure.
[2] The crystal according to [1], wherein content of Ga in metal components of the metal oxide having the corundum structure is 30 atomic % or more.
[3] The crystal according to [1] or [2] contains a dopant.
[4] A crystalline oxide semiconductor contains Ga and Mn, and has a corundum structure.
[5] The crystalline oxide semiconductor according to [4], wherein content of Ga in metal components of the crystalline oxide semiconductor having the corundum structure is 30 atomic % or more.
[6] The crystalline oxide semiconductor according to [4] or [5] contains a dopant.
[7] The crystalline oxide semiconductor according to [6], wherein content of Mn in the crystalline oxide semiconductor is less than content of the dopant.
[8] The crystalline oxide semiconductor according to [6] or [7] has a carrier density that is $1 \times 10^{15}/cm^3$ to $1 \times 10^{22}/cm^3$.
[9] The crystalline oxide semiconductor according to [6] or [7] has a carrier density that is $1.0 \times 10^{18}/cm^3$ to $1.0 \times 10^{22}/cm^3$.
[10] The crystalline oxide semiconductor according to [4] to [9], wherein the crystalline oxide semiconductor has a film shape.
[11] The crystalline oxide semiconductor according to [10] includes an m-plane as a principal plane.
[12] A semiconductor device at least includes a crystalline oxide semiconductor film, the crystal oxide semiconductor film containing the crystal according to any of [1] to [3] and/or the crystalline oxide semiconductor according to any of [4] to [11].
[13] The semiconductor device according to [12] further includes a first electrode that is arranged at a first surface of the crystalline oxide semiconductor film; and a second electrode that is arranged at the first surface of the crystalline oxide semiconductor film, and the first electrode is spaced from the second electrode.
[14] The semiconductor device according to [12] further includes a first electrode that is arranged at a first surface of the crystalline oxide semiconductor film; and a second electrode that is arranged at a second surface of the crystalline oxide semiconductor film, and the second surface is positioned at an opposite side of the first surface.
[15] The semiconductor device according to any of [12] to [14], wherein the semiconductor device is a diode or a transistor.
[16] The semiconductor device according to any of [12] to [15], wherein the semiconductor device is a MOSFET.
[17] The semiconductor device according to any of [12] to [16], wherein the semiconductor device is a power device.
[18] The semiconductor device according to any of [12] to [14], wherein the semiconductor device is a thermistor.
[19] A semiconductor system includes the semiconductor device according to any of [12] to [18].

Advantageous Effect of the Invention

In a first embodiment of the present invention, a corundum-structured crystal and/or a corundum-structured crystalline oxide semiconductor exhibit enhanced electrical properties. Also, in a second embodiment of the present invention, a thermistor having a crystalline oxide semiconductor film realizes thermistor property with enhanced sensitivity at 200° C. to 250° C. Also, in the second embodiment, a corundum-structured crystal and/or a corundum-structured crystalline oxide semiconductor is enhanced in quality and useful for the thermistor and the like.

DESCRIPTION OF EMBODIMENTS

Figure 1:
FIG. 1 shows a schematic view showing a side of a crystalline oxide semiconductor film according to a first embodiment of the present invention.

A crystal of the present invention is not particularly limited as long as the crystal contains a corundum-structured metal oxide that contains gallium (Ga) and manganese (Mn), and the crystal may be a single crystal, and also may be a polycrystal. In the present invention, it is preferable that the crystal contains the metal oxide as a major component. Herein, the term "major component" is used, for example, in a case that the metal oxide contained in the crystal accounts for 50% or more by the atomic ratio. According to the present invention, the metal oxide is preferably contained in the crystal such that the metal oxide accounts for 70% or more by the atomic ratio, and further preferably 80% or more. Content of Ga in the crystal is not particularly limited as long as an object of the present invention is not interfered with, however, the content of Ga in metal elements in the metal oxide of the crystal having a corundum structure is preferably 30 atomic % or more, further preferably 60 atomic % or more, and most preferably 90 atomic % or more. Also, content of Mn in the crystal, with respect to the content of Ga in the metal elements of the corundum-structured metal oxide, is preferably 0.1 atomic % or more. Also, the crystal is not particularly limited as long as the crystal contains Ga and Mn and has a corundum structure, and the crystal may be a mixed crystal that contains one or two or more other metal element(s) in addition to Ga and Mn. Examples of other metal element(s) include aluminum (Al), indium (In), strontium (Sr), and transition metals other than Mn, more specifically, Al, In, Sr, copper (Cu), zinc (Zn), palladium (Pd), iridium (Ir), rhodium (Rh), ruthenium (Ru), iron (Fe), molybdenum (Mo), tungsten (W), titanium (Ti), tantalum (Ta), zirconium (Zr), hafnium (Hf), niobium (Nb), vanadium (V), cobalt (Co), nickel (Ni), ruthenium (Ru), tin (Sn), and chromium (Cr).

The crystal may contain a dopant, and electrical properties are able to be enhanced by doping a dopant. As the dopant, for example, an n-type dopant and a p-type dopant may be mentioned. Examples of the n-type dopant include tin (Sn), germanium (Ge), silicon (Si), vanadium (V), niobium (Nb), tantalum (Ta), titanium (Ti), zirconium (Zr), and hafnium (Hf). Examples of the p-type dopant include magnesium (Mg) and calcium (Ca). In embodiments of the present invention, the crystal may be a crystalline oxide semiconductor. Also, the crystal may have a film shape.

The crystalline oxide semiconductor is not particularly limited as long as the crystalline oxide semiconductor contains Ga and Mn and has a corundum structure, and the crystal may be a single crystal, and also may be a polycrystal. The crystalline oxide semiconductor, generally, contains the dopant and/or oxygen vacancies. The carrier density of the dopant is not particularly limited, however, for example, preferably approximately $1\times10^{14}/cm^3$ to $1\times10^{22}/cm^3$ and further preferably $1\times10^{15}/cm^3$ to $1\times10^{22}/cm^3$. The content of Ga in the crystalline oxide semiconductor is not particularly limited as long as an object of the present invention is not interfered with, however, the content of Ga in metal elements in the metal oxide of the crystalline oxide semiconductor having a corundum structure is preferably 30 atomic % or more, further preferably 60 atomic % or more, and most preferably 90 atomic % or more. Also, the content of Mn in the crystalline oxide semiconductor is, with respect to the content of Ga in the metal elements of the corundum-structured metal oxide of the crystalline oxide semiconductor, preferably 0.1 atomic % or more. Also, the crystalline oxide semiconductor is not particularly limited as long as the crystalline oxide semiconductor contains Ga and Mn and has a corundum structure, and the crystalline oxide may be a mixed crystal that contains one or two or more other metal element(s) in addition to Ga and Mn. Examples of other metal element(s) include aluminum (Al), indium (In), strontium (Sr), transition metals other than Mn, more specifically, Al, In, St, copper (Cu), zinc (Zn), palladium (Pd), iridium (Ir), rhodium (Rh), ruthenium (Ru), iron (Fe), molybdenum (Mo), tungsten (W), titanium (Ti), tantalum (Ta), zirconium (Zr), hafnium (Hf), niobium (Nb), vanadium (V), cobalt (Co), nickel (Ni), ruthenium (Ru), tin (Sn), and chromium (Cr). Also, in embodiments of the present invention, the content of Mn in the crystalline oxide semiconductor is preferably less than the content of the dopant.

In one aspect of the present invention, a crystal contains at least Ga and Mn and has a corundum structure. Also, in another aspect of the present invention, a crystalline oxide semiconductor contains Ga, Mn, and a dopant. The crystalline oxide semiconductor may be a semiconductor film having a film shape. Further, as another aspect, the crystal or the crystalline oxide semiconductor may be a mixed crystal. When the crystalline oxide semiconductor is a mixed crystal, a mixed crystal of one or two or more metal oxide(s) is exemplified, and suitable examples of the metal oxide include, for example, gallium oxide, aluminum oxide, indium oxide, iridium oxide, rhodium oxide, and iron oxide. In an aspect of the present invention of a semiconductor device, the major component of the crystal is preferably gallium oxide. In embodiments of the present invention, if the oxide semiconductor film contains α-$Ga_2O_3$, it is sufficient that the oxide semiconductor film contains gallium to account for 30% or more by atomic ratio of gallium in metal elements of the oxide semiconductor film. In embodiments of the present invention, the atomic ratio of gallium in metal elements of the oxide semiconductor film is preferably 70% or more, and more preferably 80% or more. Also, if the crystal is a mixed crystal (e.g., a mixed crystal having a corundum structure and containing oxide of gallium, indium and/or aluminum), the major component of the oxide semiconductor film is preferably gallium oxide. As an example, even when the oxide semiconductor film contains α-$(AlGa)_2O_3$, the ratio of gallium in metal elements of the oxide semiconductor film is highest in all of the metal elements of the oxide semiconductor film and accounts for 30 atomic % or more. The crystalline oxide semiconductor film in embodiments of the present invention contains Mn and at least one dopant selected from the examples of the dopant, and content of Mn is preferably less than content of the dopant in the crystalline oxide semiconductor. As an embodiment of the present invention, the crystalline oxide semiconductor has a carrier density that is preferably within the range of $1\times10^{18}/cm^3 \sim 1\times10^{22}/cm^3$.

FIG. 1 shows a side view of a crystal in an embodiment of the present invention. The crystal may have a film shape. Also, the crystal may be a crystalline oxide semiconductor. The crystalline oxide semiconductor 2 contains Ga, Mn and a dopant and has a corundum structure. The content of Mn in the crystalline oxide semiconductor is less than the content of the dopant.

Figure 2:
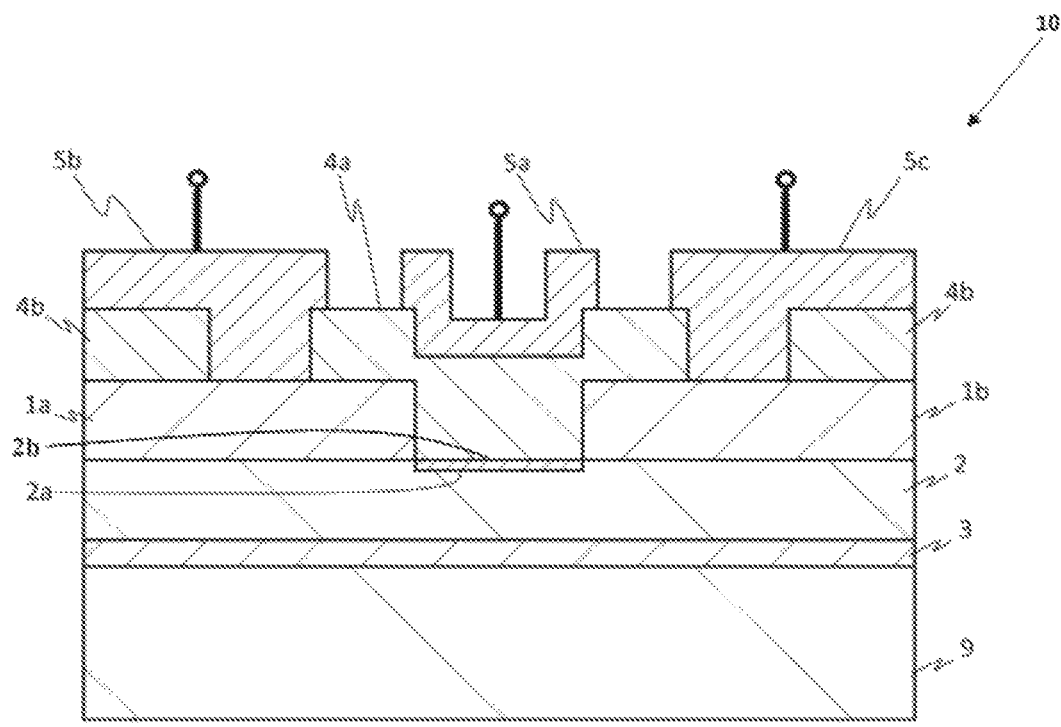
FIG. 2 shows a schematic cross-sectional view showing an example of a semiconductor device including a semiconductor film as a first embodiment of the present invention.

FIG. 2 shows a partial cross-sectional view illustrating an aspect of a semiconductor device as one of embodiments of the present invention. The semiconductor device 10 includes a crystalline oxide semiconductor 2 that contains a crystal containing at least gallium oxide, and the crystalline oxide semiconductor 2 includes an inversion channel region 2a. Furthermore, the semiconductor device 10 has a first semiconductor region 1a and a second semiconductor region 1b. In this embodiment, the inversion channel region 2a is positioned between the first semiconductor region 1a and the second semiconductor region 1b in a plan view. Further, the first semiconductor region 1a and the second semiconductor region 1b are disposed on the crystalline oxide semiconductor 2. The semiconductor device 10 further includes a substrate 9 and a metal oxide film 3 that is disposed on the substrate 9. The metal oxide film 3 contains gallium oxide, that may be contained as a major component. The metal oxide film 3 is preferably a film having a higher resistivity than the crystalline oxide semiconductor 2. The crystalline oxide semiconductor 2 may have a film shape. The semiconductor device shown in FIG. 2 is a MOSFET, in particular a lateral MOSFET, the crystalline oxide semiconductor 2 is a p-type semiconductor film and has an inversion channel region 2a, that is provided in the crystalline oxide semiconductor 2 and includes an oxide film 2b containing phosphorus is formed on a surface of the inversion channel region 2a. In this embodiment, the first semiconductor region 1a is an $n^+$-type semiconductor layer ($n^+$-type source layer). Also, the second semiconductor region 1b is an $n^+$-type semiconductor layer ($n^+$-type drain layer). In this embodiment, the crystalline oxide semiconductor 2 has a film shape. The semiconductor device 10 includes a first electrode 5b and a second electrode 5c that are arranged at a first surface of the film of the crystalline oxide semiconductor 2, and the first electrode 5b is arranged to be spaced from the second electrode 5c. In this embodiment, the first electrode 5b is a source electrode, the second electrode 5c is a drain electrode, and the semiconductor device further includes a third electrode 5a. The third electrode 5a is a gate electrode. In the present embodiment, the crystalline oxide semiconductor 2 has a corundum structure and may contain at least gallium (Ga) and manganese (Mn) and a dopant. (SBD)

Figure 3:
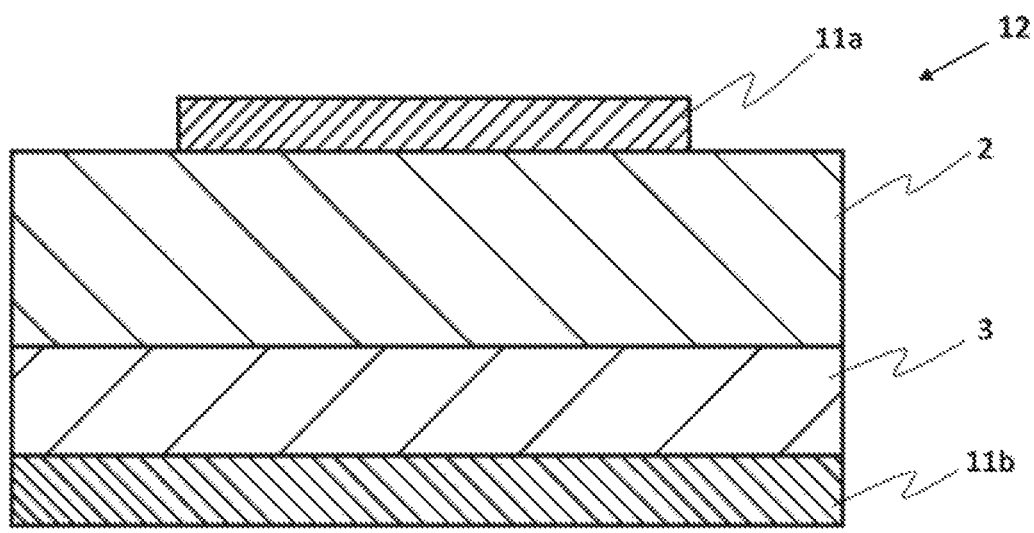
FIG. 3 shows a schematic cross-sectional view showing an example of a semiconductor device including a semiconductor film as a first embodiment of the present invention.

FIG. 3 is a partial cross-sectional view showing an embodiment of a semiconductor device of the present invention, and illustrates an example of a Schottky Barrier Diode (SBD) according to the present invention. The semiconductor device 12 includes an $n^-$-type semiconductor layer as a crystalline oxide semiconductor 2, an $n^+$-type semiconductor layer 3, a Schottky electrode 11a and an ohmic electrode 11b. In this embodiment, the crystalline oxide semiconductor 2 has a corundum structure, and contains at least gallium (Ga), manganese (Mn) and a dopant. Also, the crystalline oxide semiconductor 2 preferably has a carrier density that is in a range of $1\times10^{15}/cm^3$ to $1\times10^{22}/cm^3$.

Material(s) of Schottky and ohmic electrodes may be known electrode material(s).

Examples of the electrode material(s) include metals such as Al, Mo, Co, Zr, Sn, Nb, Fe, Cr, Ta, Ti, Au, Pt, V, Mn, Ni, Cu, Hf, W, Ir, Zn, In, Pd, Nd, Ag, or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and combination(s) of these materials.

Formation of Schottky and ohmic electrodes can be performed by a known method such as, for example, a vacuum evaporation method or a sputtering method. More specifically, for example, when a Schottky electrode is formed, a layer of Mo and a layer of Al are arranged to have a layered structure, on that patterning is performed with a technique of photolithography.

When a reverse bias is applied to the SBD shown in FIG. 3, a depletion layer (not shown) extends into the n-type semiconductor layer 2, so that the SBD has a high breakdown voltage. When a forward bias is applied to the SBD, electrons flow from the ohmic electrode 11b to the Schottky electrode 11a. Accordingly, the SBD becomes a high-voltage SBD and a large current is applicable to the SBD with enhanced switching speed, voltage and reliability.

Figure 4:
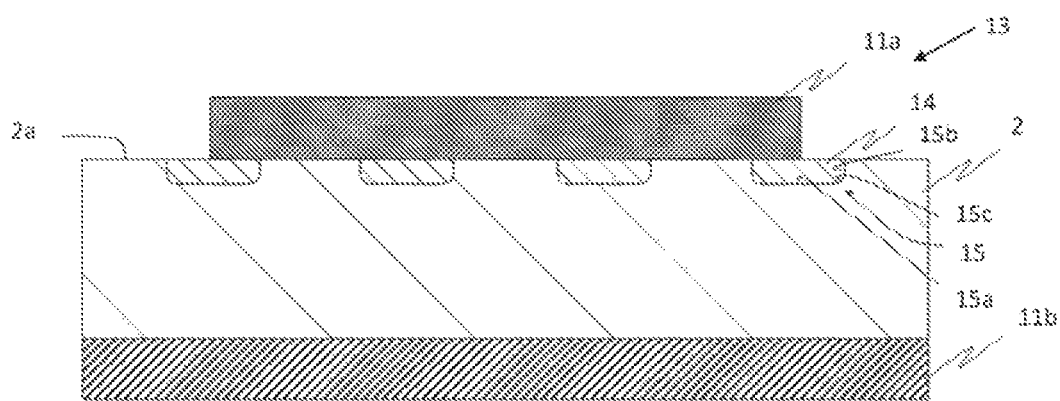
FIG. 4 shows a schematic cross-sectional view of a Junction Barrier Schottky (JBS) diode which is one of embodiments of the semiconductor device according to the present invention.

FIG. 4 shows a schematic cross-sectional view of a junction barrier Schottky (JBS) diode, which is one of embodiments of the semiconductor device according to the present invention. The semiconductor device 13 in FIG. 4 includes an area of a crystalline oxide semiconductor 2, a barrier electrode as a first electrode 11a that is arranged on and/or above the region of the crystalline oxide semiconductor 2 and capable of forming a Schottky barrier between the barrier electrode and the region of the crystalline oxide semiconductor 2, and barrier height adjustment region(s) 14 that are arranged between the barrier electrode 11a and the region of the crystalline oxide semiconductor 2 and capable of forming a Schottky barrier with greater barrier height between the barrier height adjustment region(s) and the region of the semiconductor 2 than barrier height of the Schottky barrier between the barrier electrode and the region of the crystalline oxide semiconductor 2. The barrier height adjustment region(s) 14 are buried in trench(es) 15 provided at the side of the first surface 2a in the region of the crystalline oxide semiconductor 2. In embodiments of the present invention, a plurality of trenches 15 and barrier height adjustment regions in the trenches 15 are preferably arranged at regular intervals. Also, between each of both ends of the barrier electrode, in the region of the semiconductor, the barrier height adjustment region(s) are arranged respectively. According to such a preferred configuration, the JBS diode is configured to be superior in thermal stability, adhesion, and leakage current is able to be further reduced, and furthermore, and a semiconductor property such as a high withstand voltage is achieved. The semiconductor device 13 of FIG. 4 includes an ohmic electrode as a second electrode 11b at the side of the second surface 2b of the region of the crystalline oxide semiconductor 2. The semiconductor device 13 of FIG. 4 has an arc portion 15c between the bottom surface 15a and the side surface 15b of the trench 15, the radius of curvature of the arc portion is in a range of 100 nm to 500 nm, superior in effect of electric field relaxation, and it is possible to reduce on-resistance.

Method(s) of forming each layer of the semiconductor device of FIG. 4 are not particularly limited as long as an object of the present invention is not interfered with, and may be known method(s). For example, forming a film with a method such as a vacuum evaporation method, a CVD method, a spattering method, or various coating technologies and then, patterning is performed on the film by photolithography, or directly patterning by use of printing technology or the like.

Also, in the present embodiment, trench(es) may be formed by etching the crystalline oxide. The method of etching includes at least etching the crystalline oxide, and the etching is performed on the crystalline oxide under a pressure that is 1 Pa or more and 10 Pa or less.

In the present embodiment, conventional various etchants and etching methods are able to be suitably used, and the etching may be performed by dry etching and also may be performed by wet etching, however, the etching is preferably performed with plasma etching gas, and further preferably performed using Inductively Coupled Plasma Reactive Ion Etching (ICP-RIE) apparatus. Also, in the present invention, the pressure is preferably 2 Pa or more, and most preferably 5 Pa or more. In addition, in this embodiment, the etching is preferably performed by using at least halogen, and more preferably performed by using chlorine. Also, in the present embodiment, the etching is performed preferably under an atmosphere of an inert gas, and further preferably under an atmosphere of Ar. Also, in the present invention, the etching is also preferably performed under an atmosphere of halogen gas, and further preferably performed under an atmosphere of chlorine gas because trench(es) are more suitably and easily formed for semiconductor devices such as power devices. Also, according to the present invention, the bias of the plasma of etching gas is also preferably to be 50 W or more. Also, in the present embodiment, the crystalline oxide preferably contains at least gallium. Also, in the present embodiment, the crystalline oxide preferably has a corundum structure, and further preferably has a metastable corundum structure. In addition, in the present embodiment, it is preferable that the crystalline oxide has a form of layer. Also, according to the present invention, the crystalline oxide is preferably a crystalline oxide semiconductor.

According to the above preferred method, for example, a semiconductor device including a crystalline oxide semiconductor layer that includes at least one trench, at least one electrode electrically connected to the crystalline oxide semiconductor layer, and at least one arc portion between a bottom surface and a side surface of the trench, wherein the at least one arc portion has a radius of curvature of 100 nm to 500 nm, and an angle formed by the side surface and the first surface of the crystalline oxide semiconductor layer is 90° or more, is easily obtainable.

The term "radius of curvature" means that, in the trench cross-section, a radius of a circle tangent to the curve of the arc portion. The "arc portion" may be a part of a true circle, and may be a part of an ellipse, and it is sufficient that the arc portion has a shape of arc as a whole, for example, and the arc portion may be a part of a shape of a polygon with corner portion(s) rounded. That is, it is sufficient that the arc portion, in the trench cross-section, has a curved portion provided on at least a portion between the side surface and the bottom surface. As an example, an arc portion is shown in FIG. 4. The crystalline oxide semiconductor in FIG. 4 includes an arc portion 15c with two radii of curvature. The radius curvature at R1 and R2 shown in FIG. 4 is in a range of 100 nm to 500 nm. In the present invention, setting the radius of curvature within the range, it is possible to realize an enhanced electric field relaxation effect and also to reduce the on-resistance. Further, in an embodiment of the present invention, the trench may have an arc portion 15c entirely between the bottom surface 15a and the side surface 15b of the trench.

The trench is formed in the crystalline oxide semiconductor layer, and is not particularly limited as long as an object of the present invention is not interfered with, however, in the present invention, the depth of the trench is not particularly limited, but in the present invention, the depth of the trench in the cross section of the trench is usually 200 nm or more, preferably 500 nm or more, and further preferably 1 μm or more. Note that, the upper limit of the depth of the trench is not particularly limited, however, the upper limit is preferably 100 μm, and more preferably 10 μm. Furthermore, a trench width in the cross section of the trench is not particularly limited, however, is usually 200 nm or more, preferably 500 nm or more. Note that, the upper limit of the trench width of is not particularly limited, however, is preferably 100 μm, and more preferably 10 μm. With such a trench with the preferred range, a semiconductor device such as a power device is possible to exhibit enhanced semiconductor properties. Also, in the trench cross-section, as one of other embodiments, the trench width that is narrowed toward the bottom surface is exemplified as a preferred example, and with such a preferred example, an interface is able to be formed in good condition, and better electrical characteristics are able to be obtained. Also, the side surface of the trench is tapered, and it is preferable that the side surface has a tapered angle with respect to the first surface of the crystalline oxide semiconductor layer.

Figure 5:
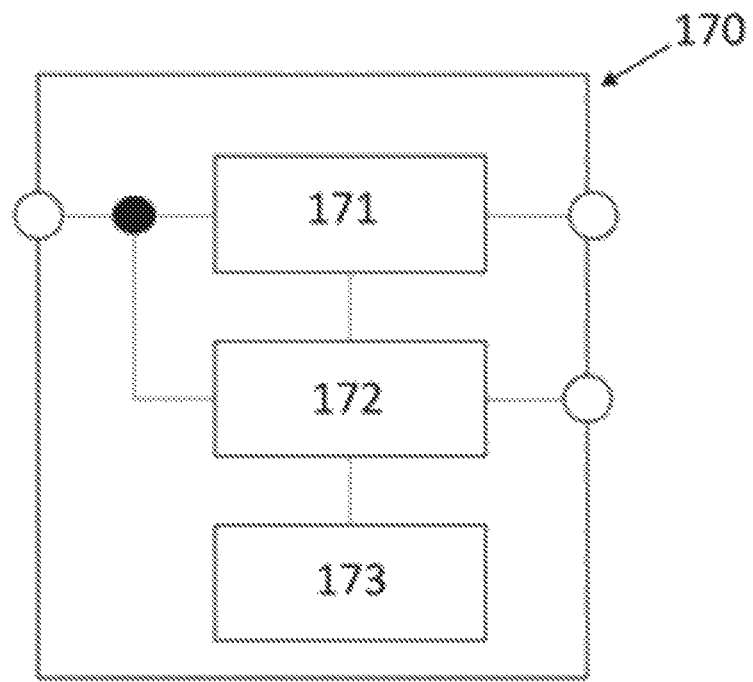
FIG. 5 shows a schematic view of a power system as an example.

FIG. 5 shows a schematic view of a power circuit of a power system as an example.

Figure 6:
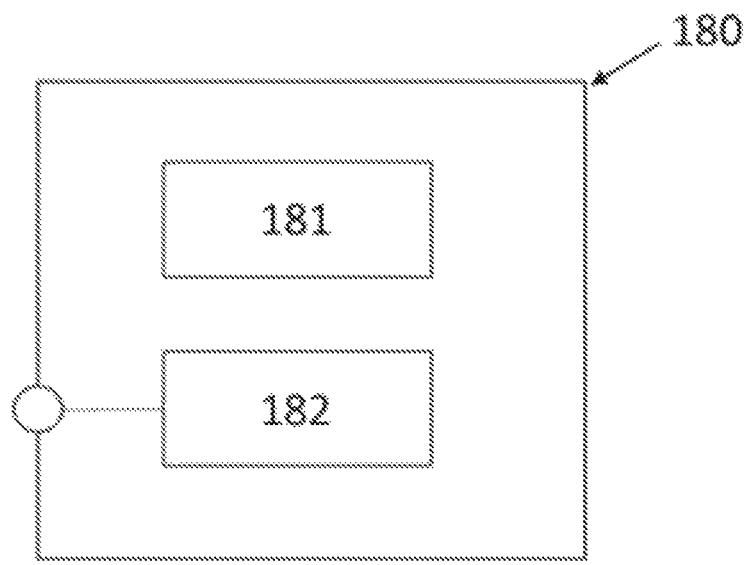
FIG. 6 shows a schematic view of a system device as an example.
Figure 7:
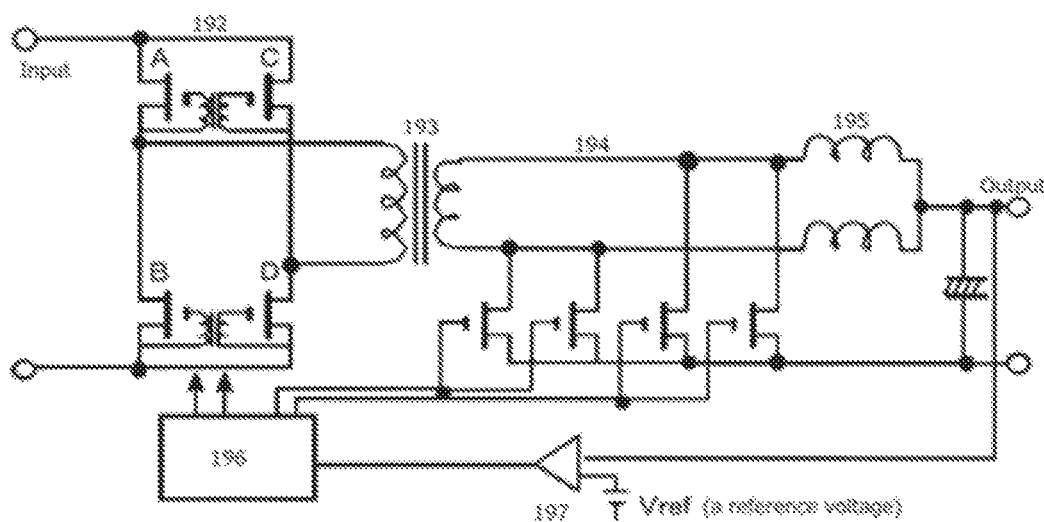
FIG. 7 shows a schematic view of a power source circuit of a power source device as an example.

The Semiconductor device in an embodiment of the present invention, in addition to the above description, is suitably used as a power module, an inverter or a converter, and furthermore, for example, suitably used in a semiconductor system using a power device. The power device is able to be manufactured from the semiconductor device(s) or as a semiconductor device by connecting to wiring pattern(s) or the like using known method(s). FIG. 5 shows a power system 170 including two or more power devices 171 and 172, and a control circuit 173. The power system 170 shown in FIG. 6, is able to be used in combination with an electric circuit 181 and the power system 182 in a system device 180. Also, FIG. 7 shows an example of a schematic diagram of a power supply circuit of a power supply device. FIG. 7 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter 192 and the rectification MOSFETs 194 by a PWM control circuit 196 to have a desired output voltage.

In a second aspect of the present invention, a crystalline oxide semiconductor is a thermistor film used for a thermistor, and not particularly limited as long as the thermistor film contains as a major component the crystal or the crystalline oxide semiconductor as a major component. Here, the term "major component" means that it is sufficient that the crystal or the crystalline oxide semiconductor is contained in the thermistor film to account for 50% or more by atomic ratio. In the present invention, the atomic ratio of the crystalline oxide semiconductor is preferably 70% or more by atomic ratio in the film, and further preferably 80% or more. Also, the film thickness of the thermistor film is not particularly limited, however, preferably 10 μm or less, and more preferably 0.001 μm to 10 μm.

The thermistor film is suitably used for various thermistors. In the present invention, the thermistor preferably includes a thermistor film, a first electrode disposed at a first surface of the thermistor film, and a second electrode disposed at a second surface that is positioned on an opposite side of the first surface.

Hereinafter, preferred embodiments of the thermistor will be described, but the present invention is not limited to these embodiments.

As one of preferred embodiments of the thermistor of the present invention, the thermistor includes at least a thermistor film and electrode(s). The thermistor preferably includes a thermistor film containing as a major component a corundum-structured crystalline oxide semiconductor that contains Ga and Mn, a first electrode disposed on a side of a first surface of the thermistor film and a second electrode disposed on a side of a second surface that is positioned at an opposite side of the first surface of the thermistor film.

Figure 11:
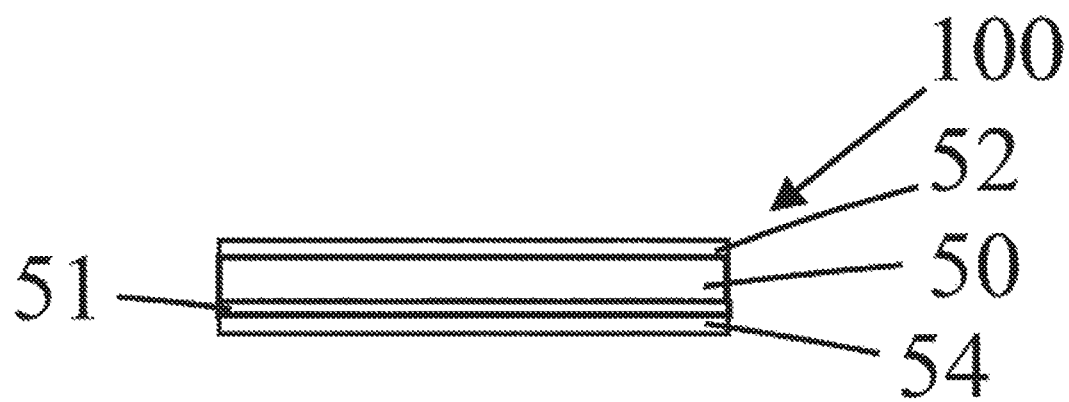
FIG. 11 shows an example of a thermistor according to a second embodiment of the present invention.
Figure 12:
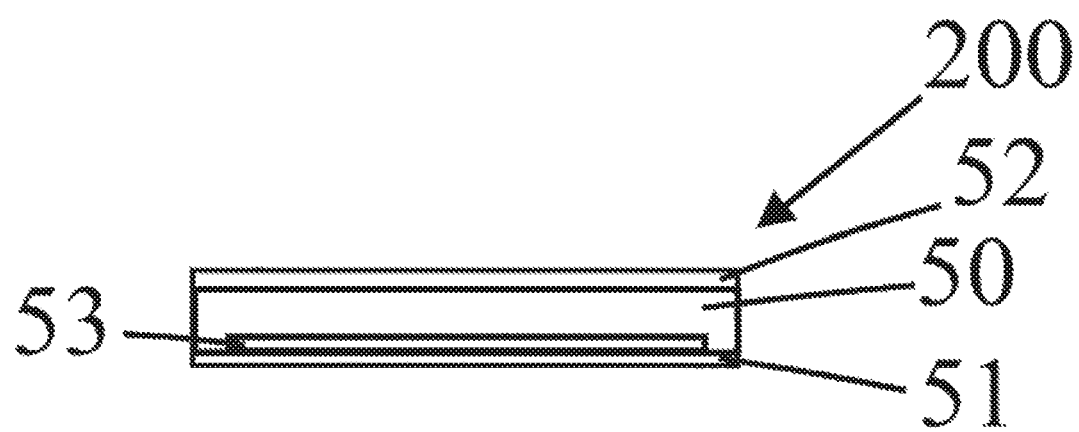
FIG. 12 shows a schematic configuration figure showing an example of a thermistor according to a second aspect of the present invention.
Figure 13:
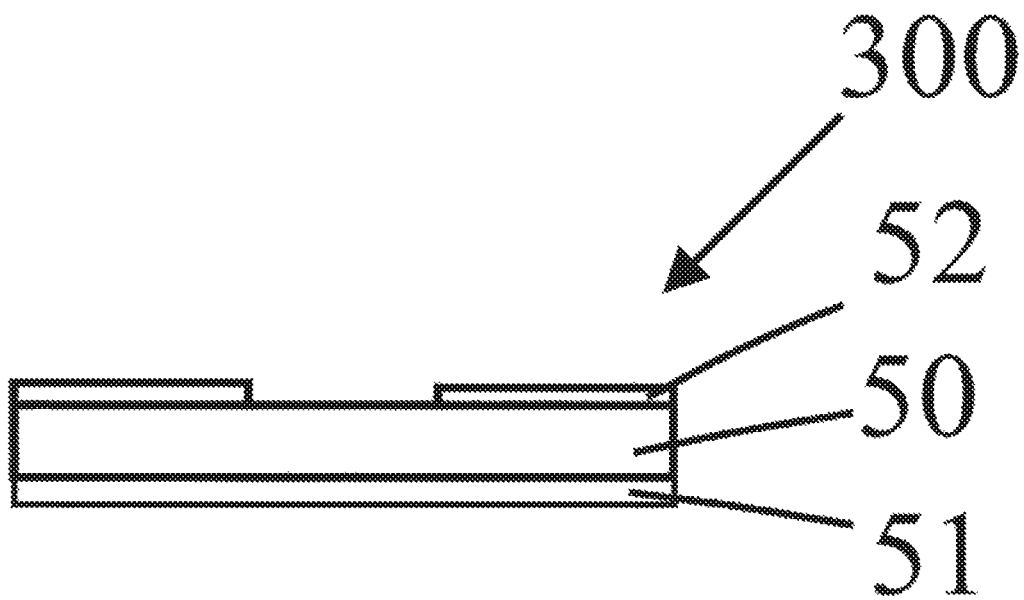
FIG. 13 shows a schematic configuration figure showing an example of a thermistor according to a second aspect of the present invention.
Figure 14:
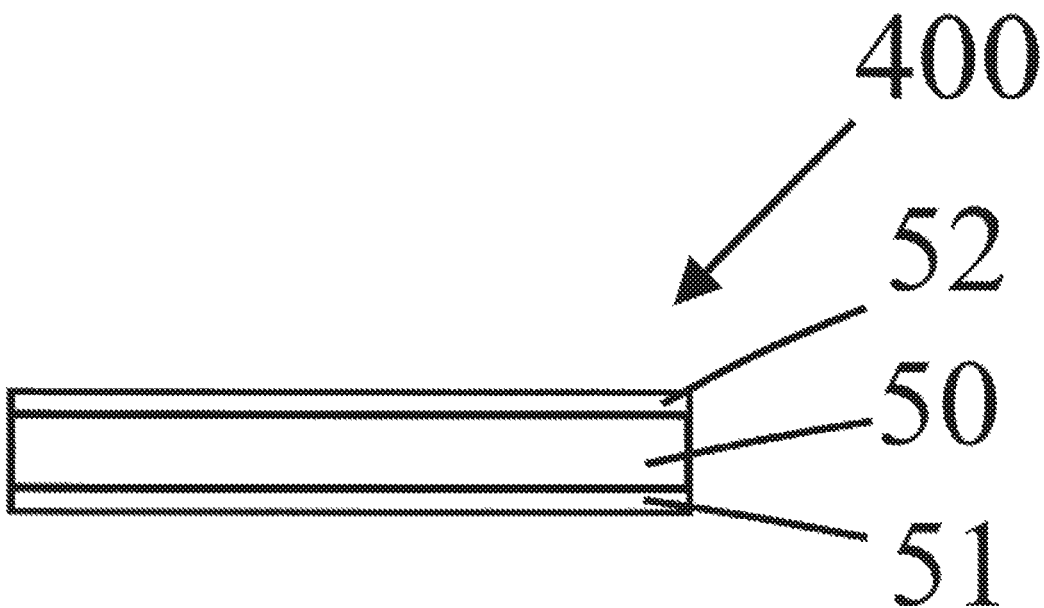
FIG. 14 shows a schematic configuration figure showing an example of a thermistor according to a second aspect of the present invention.
Figure 15:
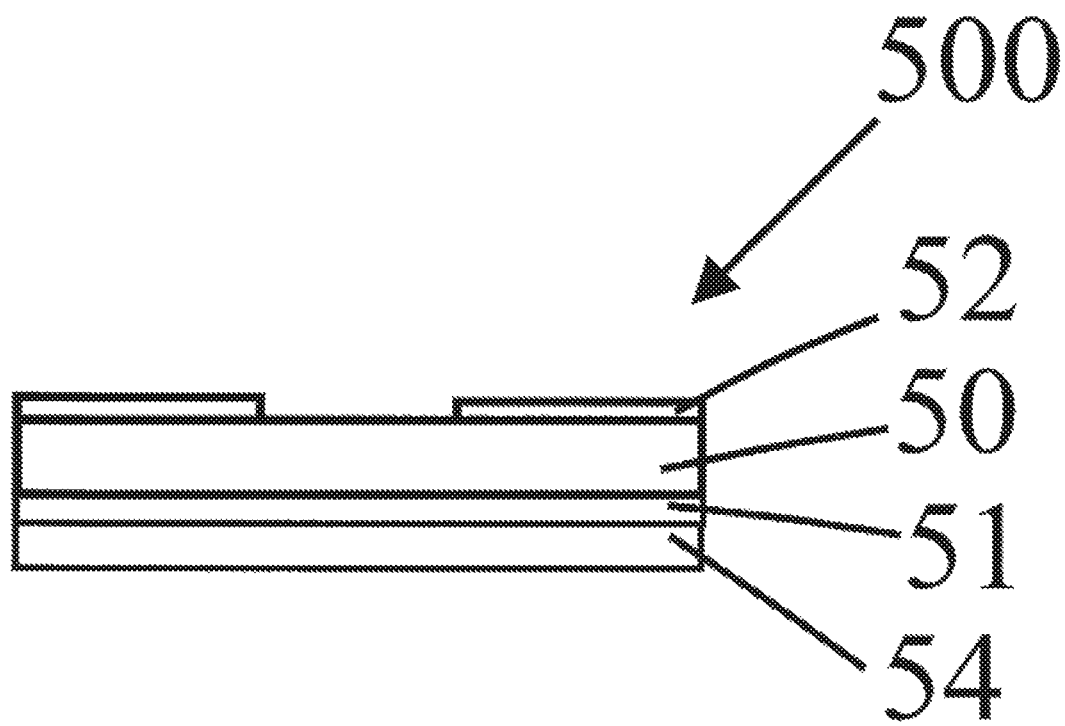
FIG. 15 shows a schematic configuration figure showing an example of a thermistor according to a second aspect of the present invention.
Figure 16:
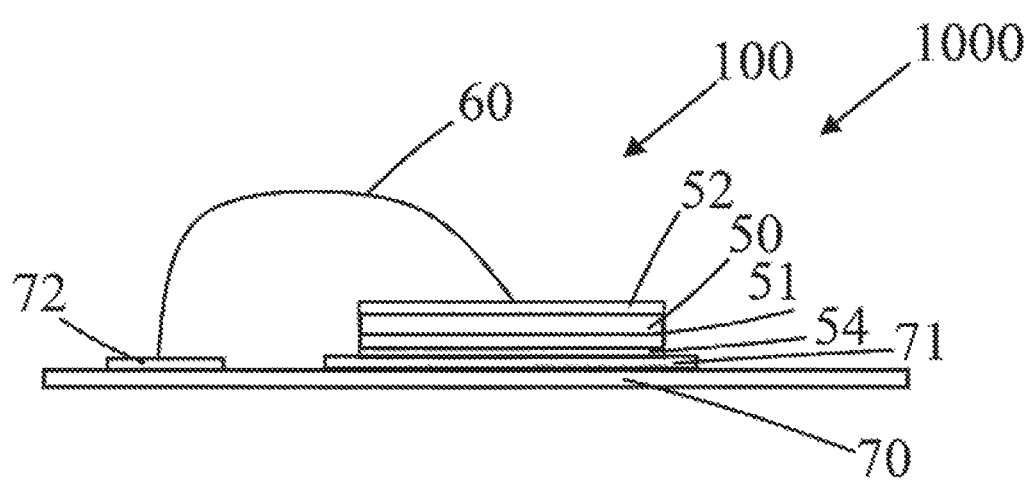
FIG. 16 shows a schematic configuration figure showing an example of a thermistor according to a second aspect of the present invention mounted on a circuit substrate.

In the present invention, it is preferable that the thermistor is a vertical device. In the case of such a preferred thermistor element, it becomes more enhanced in low resistance and heat dissipation. Further, the thermistor of the present invention includes a first electrode disposed on the side of the first surface of the thermistor film, and a second electrode disposed on the side of the second surface that is positioned at the opposite side of the first surface of the thermistor film. FIG. 11 is a schematic configuration diagram showing a preferred embodiment of a thermistor of the present invention. A thermistor element 100 includes a thermistor film 50, a first electrode 51 arranged at a first surface of the thermistor film 50, and a second electrode 52 arranged at a second surface positioned on the opposite side of the first surface of the thermistor film 50. The first electrode 51 and the second electrode 52 are configured to be longitudinally electrically conductive. Also, the thermistor further includes a base 54 in contact with the first electrode 51. The base 54 may contain a metal film with electrical conductivity. A conductive metal film arranged on a surface of the base makes it easier to mount the thermistor element on a circuit substrate. Also, the base 54 is not particularly limited, however, may be a corundum-structured crystalline substrate. If the base 54 is a crystalline substrate, and a thermistor film is formed by crystal growth to have a flatter surface, and it is advantageous. FIG. 12 shows a schematic configuration diagram showing a preferred embodiment of a thermistor of the present invention. The thermistor element 200 includes a thermistor film 50, a first electrode 51 disposed on a side of the first surface of the thermistor film 50, and a second electrode 52 disposed on a side of the second surface positioned on the opposite side of the first surface of the thermistor film 50. The thermistor element 200 of this embodiment may include a layer 53 positioned between first electrode 51 and the thermistor film 50. The layer 53 may be a crystalline film. FIG. 13 is a schematic configuration diagram showing a preferred embodiment of a thermistor of the present invention. The thermistor element 300 includes a thermistor film 50, a first electrode 51 disposed on the first surface of the thermistor film 50, and a second electrode 52 disposed on the second surface positioned on the opposite side of the first surface of the thermistor film 50. As shown in FIG. 13, it is also possible to provide two or more electrodes as the second electrode. FIG. 14 is a schematic configuration diagram showing a preferred embodiment of a thermistor of the present invention. The thermistor element 400 includes a thermistor film 50, a first electrode 51 disposed on the first surface of the thermistor film 50, and a second electrode 52 disposed on the second surface positioned on the opposite side of the first surface of the thermistor film 50. FIG. 15 is a schematic configuration diagram showing a preferred embodiment of a thermistor of the present invention. The thermistor element 500 has a thermistor film 50, a first electrode 51 disposed on the first surface of the thermistor film 50, and a second electrode 52 disposed on the second surface positioned on the opposite side of the first surface of the thermistor film 50. The base 54 that is arranged to be in contact with the first electrode 51 is, for example, a sapphire substrate, an upper electrode electrically connected to the first electrode 51 may be arranged on a same side of the second electrode 52. Also, as shown in FIG. 16, the first electrode 51 of the thermistor element 100 may be electrically mounted on a first electrode 71 arranged on the circuit substrate 70 of the electronic device 1000 via an electrically conductive base 54 by soldering, for example, and the second electrode positioned on the upper surface of the thermistor element 300 may be electrically mounted on a second electrode 72 on the circuit substrate 70 by wire bonding 60 or the like. In this way, it can be used as a vertical device.

(Thermistor Film)

The thermistor film of the present invention will be described in more details. The thermistor film may be an NTC thermistor film or a PTC thermistor film. Furthermore, the thermistor film according to the present invention may further have a crystal structure other than a corundum structure. The thermistor film is able to be obtained, for example, by preferred aspects described below.

The preferred aspects will be described. In the present invention, forming the thermistor film is preferably performed by a mist CVD method, and it is more preferable that a raw-material solution of the thermistor film is atomized (forming atomized droplets), droplets are floated to be atomized droplets, and the atomized droplets (including mist) that are obtained are supplied with carrier gas and conveyed to a substrate (carrying the atomized droplets), and then the atomized droplets are thermally reacted on the base (formation of film). Note that the crystal or the crystalline oxide semiconductor is able to be formed in the same manner as the method of forming the thermistor film described above.

(Base)

The base is not particularly limited and may be crystalline or amorphous. Material(s) of the base is not particularly limited as long as an object of the present invention is not interfered with, and may be a known base, and may be of an organic compound and may be of an inorganic compound. Examples of the shape of the base include a plate shape, such as a flat plate and a disk, a fibrous shape, a rod shape, a cylindrical shape, a prismatic shape, a tubular shape, a spiral shape, a spherical shape, and a ring shape, and according to the present invention, a substrate is preferable. In the present invention, the substrate preferably contains a crystal in at least a part of a surface or a whole surface, and more preferably a crystalline substrate having a crystal formed at a whole surface of a major plane or a part of the major plane of the crystal growth side, and most preferably a crystalline substrate having a crystal having a crystal at the whole surface of the major plane. The crystal is not particularly limited as long as an object of the present invention is not interfered with, however, preferably a crystal with a trigonal crystal structure or a hexagonal crystal structure, and further preferably a crystal with a corundum structure. Also, in embodiments of the present invention, if the crystalline substrate has a corundum structure, the principal plane is preferably a c-plane, an a-plan or an m-plane to enhance thermistor properties. Also, one of embodiments of the present invention, it is preferable that the major plane is m-plane to further enhance electrical characteristics. Furthermore, the crystal substrate may have an off-angle that is, for example, 0.1° to 12.0°. Herein, the term "off-angle" refers to an angle formed between a surface of a substrate and a crystal-growth surface. The shape of the substrate is not particularly limited as long as the substrate has a plate shape and serves as a support for the crystalline oxide semiconductor film. The base may be an insulation substrate or may be a semiconductor substrate, however, according to the present invention, the base including a metal film having a conductivity, such as a nickel foil, a precious metal foil or the like formed on a surface of the base may be preferable. Furthermore, in the present invention, the substrate is also preferable to be a conductive substrate. Examples of the conductive substrate include one or two or more metals of Group 3 to Group 15 in the periodic table, and more preferably one or two or more of transition metals of Group 7 to Group 11 in the periodic table. The shape of the substrate is not particularly limited, and may be a substantially circular shape (e.g., circular, elliptical, etc.), or may be a polygonal shape (e.g., a triangle, a square, a rectangle, a pentagon, a hexagon, a heptagon, an octagon, a nonagon, etc.), and various shapes may be suitably used. In the present invention, by making the shape of the substrate into a preferred shape, a film to be formed on the substrate is able to be set to have a desired shape. Furthermore, in the present invention, it is also possible to use a substrate having a larger area, and by using such a substrate having a larger area, it is possible to increase the area of the crystalline oxide semiconductor film. Substrate material(s) is not particularly limited as long as the substrate material(s) is not interfered with the object of the present invention, and may be a known one. Preferred examples of the substrate materials with a corundum structure include $\alpha$-$Al_2O_3$ (sapphire substrate) and $\alpha$-$Ga_2O_3$, and a c-plane sapphire substrate, an a-plane sapphire substrate, an m-plane sapphire substrate and a-gallium oxide substrate (a c-plane, an a-plane, or an m-plane) as further preferred examples.

Furthermore, in the present invention, it is preferable that the base has a flat surface, however, the base may have an uneven shape on at least a part of a surface or a whole surface of the base, and when the base is a crystalline base, it is preferable because the quality of crystal-growth of the film is able to be improved. The base having the uneven shape is sufficient as long as the uneven portion of uneven shape (a recessed portion) or uneven shape (a projected portion) is formed in at least a part of a surface or a whole surface, the uneven portion is not particularly limited as long as it includes uneven shape (a projected portion) and/or uneven shape (a recessed portion), may be an uneven portion made of uneven shape (a projected portion), may be an uneven portion made of uneven shape (a recessed portion), it may be an uneven portion made of uneven shape (a projected portion) and uneven shape (a recessed portion). Further, the uneven portion may be formed from regular uneven shape (a projected portion) or uneven shape (a recessed portion), it may be formed from irregular uneven shape (a projected portion) or uneven shape (a recessed portion). In the present invention, it is preferable that the uneven portion is periodically formed, more preferably periodically and regularly patterned. The shape of the uneven portion is not particularly limited, for example, may be stripe-shaped, dot-shaped, mesh-shaped or random, but in the present invention, preferably dot-shaped or stripe-shaped, and further preferably dot-shaped. Further, when the uneven portion is periodically and regularly patterned, the pattern shape of the uneven portion may be preferably triangular, square (e.g., square, rectangular or trapezoidal, etc.), polygonal shape such as pentagonal or hexagonal, circular, or elliptical. In the case of forming the uneven portion in dots, dots are preferably arranged in a lattice shape such as a square lattice, an orthorhombic lattice, a triangular lattice, a hexagonal lattice, and more preferably a triangular lattice. The cross-sectional shape of uneven shape (a recessed portion) or uneven shape (a projected portion) of the uneven portion is not particularly limited, for example, U-shaped, inverted U-shaped, corrugated, or triangular, square (e.g., square, rectangular or trapezoidal, etc.), a polygon such as a pentagon or a hexagon.

(Raw-Material Solution)

The raw-material solution is a raw-material solution of a crystal and/or a crystalline oxide semiconductor (hereinafter, also mentioned as film) and not particularly limited as long as the raw-material solution is able to be atomized and/or formed into droplets, and may contain an inorganic material or may contain an organic material. In the present invention, the raw-material solution usually contains a metal of the crystalline oxide. The metal may be a single substance of metal, and also may be a metal compound, and not particularly limited as long as an object of the present invention is not interfered with. The content of the metal in the raw-material solution is not particularly limited, but is preferably 0.001 weight % to 80 weight %, and more preferably 0.01 weight % to 80 weight %.

In the present invention, as the raw-material solution, a raw-material solution containing an organic solvent or water in which the metal is dissolved or dispersed in the form of a complex or in the form of a salt can be suitably used. Examples of the form of the complex include an acetylacetonate complex, a carbonyl complex, an ammine complex, and a hydride complex. Examples of the form of the salt include organometallic salts (e.g., metal acetate, metal oxalate, metal citrate, etc.), metal sulfide salts, nitrified metal salts, phosphorylated metal salts, metal halide salts (e.g., metal chloride salts, metal bromide salts, metal iodide salts, etc.), and the like.

A solvent of the raw-material solution is not particularly limited, and may be an inorganic solvent such as water, etc., also may be an organic solvent such as alcohol, etc., and also may be a mixed solvent of an inorganic solvent and an organic solvent. In the present invention, the solvent preferably contains water, the solvent is further preferably a mixed solvent of water and alcohol, and is most preferably water. Examples of the water, specifically, include pure water, ultrapure water, tap water, well water, mineral water, hot spring water, spring water, fresh water and ocean water, however, in the present invention, ultrapure water is preferable.

To the raw-material solution, an additive, such as hydrohalic acid and an oxidant, may be mixed. Examples of the hydrohalic acid include hydrobromic acid, hydrochloric acid, and hydroiodic acid. Examples of the oxidant include: peroxides, such as hydrogen peroxide ($H_2O_2$), sodium peroxide ($Na_2O_2$), barium peroxide ($BaO_2$), and benzoyl peroxide ($C_6H_5CO)_2O_2$; hypochlorous acid (HClO); perchloric acid; nitric acid; ozone water; organic peroxides, such as peracetic acid and nitrobenzene. The raw-material solution may contain a dopant. By the raw-material solution containing a dopant, properties of the film to be obtained are able to be controlled.

(Forming Atomized Droplets)

At the forming atomized droplets, the raw-material solution is atomized. The forming atomized droplets is not particularly limited as long as the raw-material solution is able to be atomized, and a known method may be used, however, in the present invention, a method of atomization using ultrasonic vibration is preferable. The atomized droplets used in the present invention are floating in the space with the initial velocity that is zero are carriable as a gas, and the atomized droplets floating in the space are preferable to avoid damage caused by the collision energy without being blown like a spray. The size of droplets is not limited to a particular size, and may be a few mm, however, the size of atomized droplet(s) is preferably 50 μm or less, and further preferably in a range of 1 μm to 10 μm.

(Carrying the Atomized Droplets)

In carrying the atomized droplets, the atomized droplets are carried by carrier gas onto a base. The carrier gas is not particularly limited as long as an object of the present inventive subject matter is not interfered with. Preferable examples of the carrier gas include oxygen, ozone, and an inert gas (e.g., nitrogen, argon, etc.), and a reducing gas (e.g., hydrogen gas, forming gas, etc.). One or more carrier gas of the examples may be used, and a dilution gas (e.g., 10-fold dilution gas) may be used as a second carrier gas. Also, the carrier gas may be supplied from one or two or more locations. While the flow rate of the carrier gas is not particularly limited, however, the flow rate of the carrier gas may be preferably regulated to be 0.01 L/min to 20 L/min, further preferably to be 0.1 L/min to 10 L/min. For the dilution gas, the flow rate of the dilution carrier gas is preferably 0.001 L/min to 10 L/min, and further preferably to be 0.1 L/min. to 5 L/min.

(Forming a Film)

In forming a film, the atomized droplets are reacted to form a film on a base. The reaction is not particularly limited as long as a film is formed from the atomized droplets by the reaction, and conditions of reaction are not particularly limited as long as an object of the present invention is not interfered with. In the present process, the thermal reaction is usually conducted at an evaporation temperature of the solvent or higher temperatures. Also, the thermal reaction may be carried out in any atmosphere from a vacuum, a non-vacuum, a non-oxygen atmosphere, a reducing-gas atmosphere, and an oxygen atmosphere, however, in the present invention, the thermal reaction is preferably conducted in a non-vacuum atmosphere, and further preferably in a nitrogen atmosphere or an oxygen atmosphere. Also, the thermal reaction may be conducted under any conditions of atmospheric pressure, increased pressure, and reduced pressure, however, according to the present invention, the thermal reaction is preferably carried out under an atmospheric pressure. The thickness of the film is able to be easily set by adjusting a film-formation time. Also, according to the present invention, the film may be a single film and also may be a multilayer film.

In the present invention, after a film is formed, it is also preferable that annealing is carried out. The annealing temperature is not particularly limited as long as an object of the present inventive subject matter is not interfered with, and is generally carried out at a temperature of 300° C. to 1100° C. and preferably 500° C. to 1000° C. Also, the annealing time is generally one minute to 48 hours, preferably 10 minutes to 24 hours, and further preferably 30 minutes to 12 hours. The annealing treatment may be carried out in any atmosphere as long as an object of the present inventive subject matter is not interfered with.

The film obtained as described above is enhanced in quality and surface characteristics such as adhesion, and is able to be used, as it is or after a treatment such as separation or process is performed, in a thermistor by arranging an electrode on the film, for example.

Figure 18:
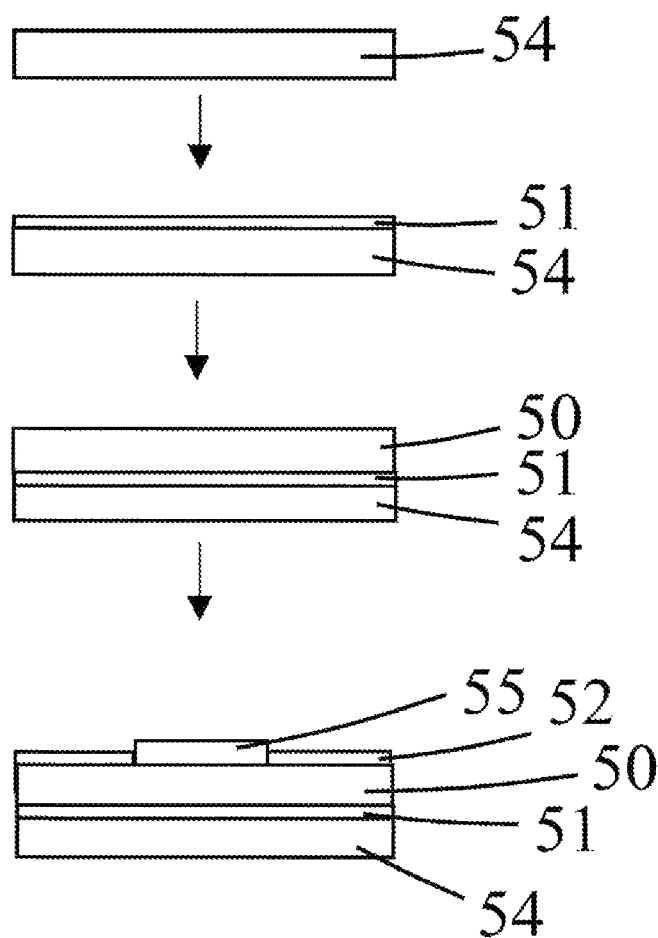
FIG. 18 shows an example of a method.
Figure 19:
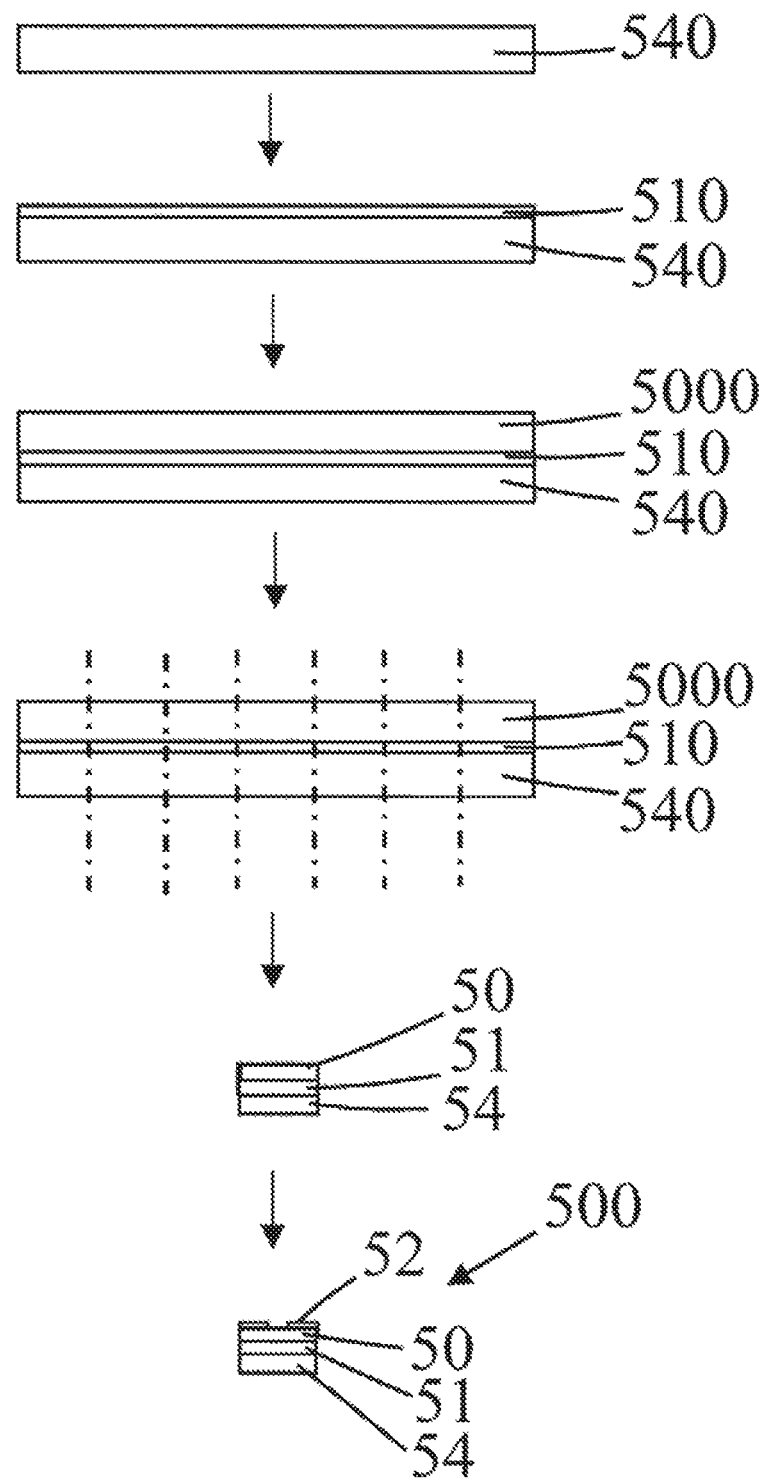
FIG. 19 shows an example of a method.

A preferred method of manufacturing the thermistor includes forming a first electrode, forming the film by a mist CVD method such that at least a portion of the film is in contact with the first electrode, and forming a second electrode such that at least a portion of the second film contacts the film. FIG. 18 shows an example of a manufacturing method, includes forming a first electrode 51 on a base 54, growing a semiconductor film by a mist CVD method to be a thermistor film 50 such that at least a part of the semiconductor film is in contact with the first electrode 51. Furthermore, a second electrode 52 is formed. FIG. 19 shows an example of a method of manufacturing collectively. A first electrode layer 510 is formed on a base 540 having a larger-size. A thermistor film 5000 is formed by the mist CVD method to be at least partly in contact with the first electrode layer 510, and then, diced lengthwise and crosswise into a plurality of thermistor elements. Also, second electrodes 52 may be respectively formed on thermistor elements.

Further, the thermistor is able to be used generally as a temperature sensor and/or a temperature control device, the temperature sensor and/or the temperature control device on that the thermistor is mounted, is further applicable to products such as electronic devices and/or systems. Also, as the products, for example, products using temperature sensor(s) for 200° C. or higher temperatures. Further, according to the present invention, it is suitably applicable to a system including at least the product and the CPU. Examples of the product, is not particularly limited, for example, may be a portable terminal, business equipment, cooking equipment, manufacturing equipment, gas processors, CPU-mounted devices, base stations of mobile phones and 5G radio devices, sensor devices for vehicles, and temperature-compensating elements for new devices (e.g., IoT and AI).

Figure 21:
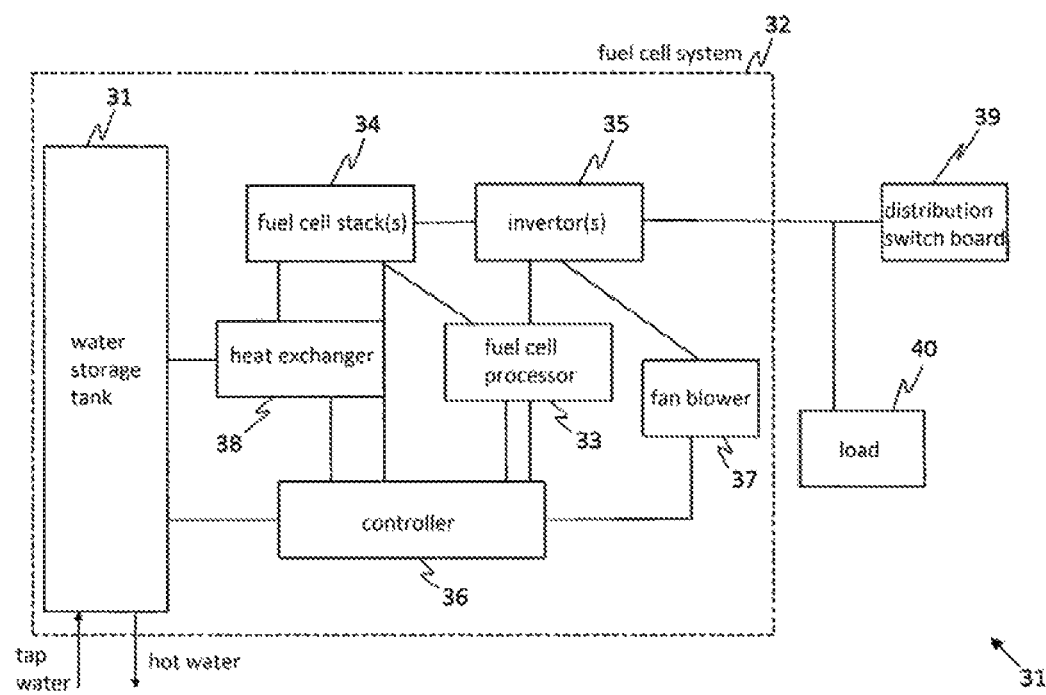
FIG. 21 shows, as a preferred example, a fuel cell system in that a product according to the present invention is used.

A preferred embodiment using the temperature sensor is explained, however, the present invention is not limited thereto. FIG. 21 is a block diagram illustrating an example of a power generation system including the product and a CPU (controller). The power generation system 30, for example, includes a fuel cell system 32. The fuel cell system 32 includes a fuel cell processor 33 that is configured to generate fuel gas containing hydrogen as a major component from an original gas that may be a utility gas through steam-reforming, water-gas shift reaction, and selective oxidation reaction, a stack (fuel cell stack) 34 that is configured to generate electricity by chemical reaction of the fuel gas and an oxidizing gas, an inverter 35 exchanging output DC (direct current) power with AC (alternating current) power, a controller (CPU) 36 for controlling a series of operations of starting the fuel cell system, generating power, termination, and suspension, a blower 37 supplying air containing oxygen by oxidant gas to the stack 34, a heat exchanger 38 configured to collect heat generated from the stack 34 and store as hot water in a water storage tank 43, and a temperature control device arranged inside. Also, in FIG. 21, the fuel cell system 32 is connected to a commercial AC via a distribution switch board 39, which is installed, for example in a house. Also, a load 40 such as home appliances and industrial products is connected between the distribution switch board 39 and the fuel cell system. Generating power by the stack 34 is started, current is supplied through the inverter 35 to the load 40, the load 40 is activated and heat generated by power generation of the stack 34 is configured to be utilized and efficiently stored as hot water in the water storage tank 31. The storage tank 31 is provided with a temperature sensor that controls the temperature of the water storage tank 31. It is not shown in figures, however, a gas sensor is provided with the fuel processor 33 that controls the generation of fuel gas. As described above, the thermistor film may be useful in any system in which a temperature controller and/or a temperature sensor is used.

Practical examples according to the present invention are explained as follows, however, the present invention is not limited thereto.

Practical Example 1

1. A Film (Layer)-Formation Apparatus

Figure 17:
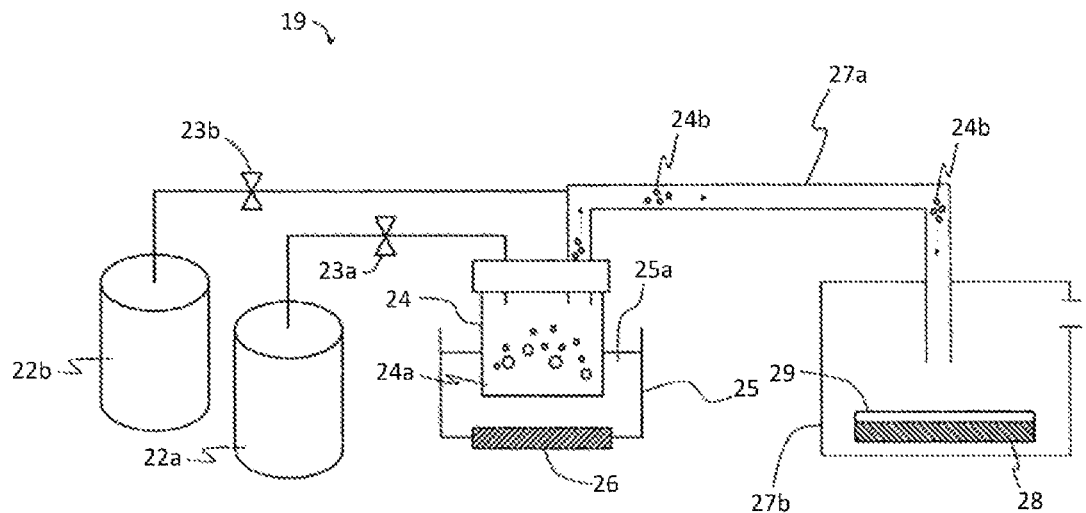
FIG. 17 shows a schematic diagram of a film (layer)-formation apparatus (a mist CVD apparatus) used in Practical Example 1.

With reference to FIG. 17, a mist CVD apparatus 19 used in Practical Examples is explained. The mist CVD apparatus 19 includes a carrier gas supply device 22a to supply carrier gas, a flow-control valve 23a to control a flow of carrier gas that is configured to be sent from the carrier gas supply device 22a, a carrier gas (dilution) supply device 22b, a flow-control valve 23b to control a flow of carrier gas that is configured to be sent from the carrier gas (dilution) supply device 22b, a mist generator 24 in that a raw-material solution 24a is contained, a container 25 in that waterer 25a is contained, an ultrasonic transducer 26 attached to a bottom surface of the container 25, a film-formation chamber 27b, a supply pipe 27a that connects the mist generator and the film-formation chamber 27b, a hot plate 28 placed in the film-formation chamber 27b, and an exhaust port to exhaust mist, droplets, and exhaust gas after thermal reaction. A substrate 29 is placed on the hot plate 28.

2. Preparing a Raw-Material Solution

A raw-material solution was prepared by mixing manganese acetylacetonate and gallium acetylacetonate into water to obtain a film such that the atomic ratio of Ga:Mn to be 100:2 in the film that was to be obtained.

3. Film (Layer)-Formation Preparation

The raw-material solution 24a that was obtained at 2. above was set in a container of the mist generator 24. Then, a sapphire substrate was placed as the substrate 29 on a hot plate 28, and the hot plate 28 was activated to raise the temperature up to 900° C. Next, the flow-control valves 23a, 23b were respectively opened to supply carrier gas from the carrier gas supply device 22a and the carrier gas (dilution) supply device 22b, which are the source of carrier gas, into the film-formation chamber 27b to replace the atmosphere in the film-formation chamber 27b with the carrier gas sufficiently, and then, the flow rate of the carrier gas was regulated at 3 L/min. and the carrier gas (dilution) was regulated at 0.5 L/min. In this embodiment, nitrogen was used as the carrier gas.

4. Formation of a Film

Figure 20:
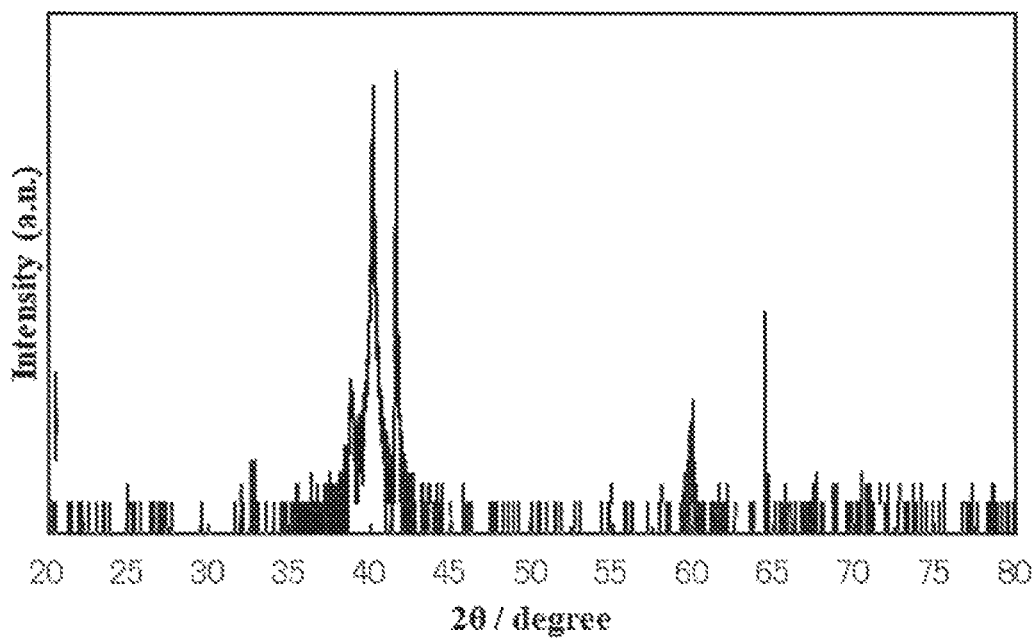
FIG. 20 shows X-Ray Diffraction (XRD) data in the Practical Example 1.
Figure 22:
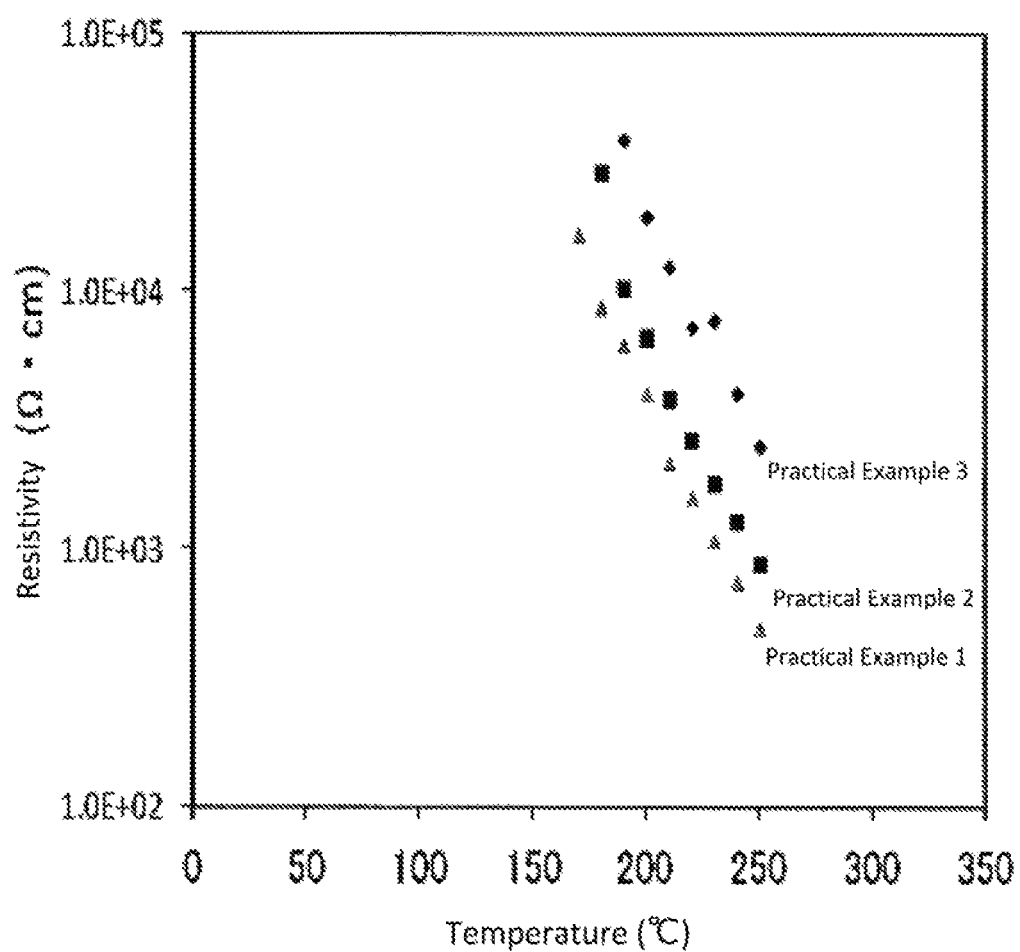
FIG. 22 shows evaluation results of thermistor characteristics in Practical Examples 1 to 3.

The ultrasonic transducer 26 was then activated to vibrate at 2.4 MHz, and vibrations were propagated through the water 25a to the raw-material solution 24a to turn the raw-material solution 24a into atomized droplets. The atomized droplets were introduced in the film-formation chamber 27b with the carrier gas, and introduced in the film (layer)-formation chamber 27b and reacted under atmospheric pressure at 500° C. to be formed into a film on the substrate 29. The film thickness was 0.5 μm and the film-formation time was 60 minutes. The film that was obtained was a film enhanced in adhesion without causing peeling or the like, and the mechanical strength was also sufficient. The results of XRD are shown in FIG. 20. As shown in FIG. 20, it can be seen that the film that was obtained contains $\alpha\text{-}Ga_2O_3$ and has a corundum structure. Also, resistance value was measured and thermistor characteristics were evaluated. The evaluation results are shown in FIG. 22. FIG. 22 shows that the film has good NTC thermistor characteristics Also, the B constant was 10337 at 200° C. to 250° C.

Practical Examples 2 and 3

Thermistor films in Practical Example 2 and Practical Example 3 were respectively obtained by the same conditions of the Practical Example 1 except the composition ratio of the films were set as shown in the Table 1 below. Each of the films obtained in the Practical Example 2 and the Practical Example 3 was a film that is superior in adhesiveness without causing peeling, and the mechanical strength was also sufficient. Furthermore, resistance value was measured, thermistor properties were evaluated, and the films were found to have enhanced NTC thermistor properties (as shown in FIG. 22 and Table 1) similarly to the Practical Example 1.

TABLE 1

|  | Ga:Mn (Atomic Ratio) | B constant (200° C.~250° C.) |
| --- | --- | --- |
| Practical Example 1 | 100:2 | 10337 |
| Practical Example 2 | 100:1 | 10005 |
| Practical Example 3 | 100:0.5 | 10094 |

Practical Examples 4 to 14

Figure 8:
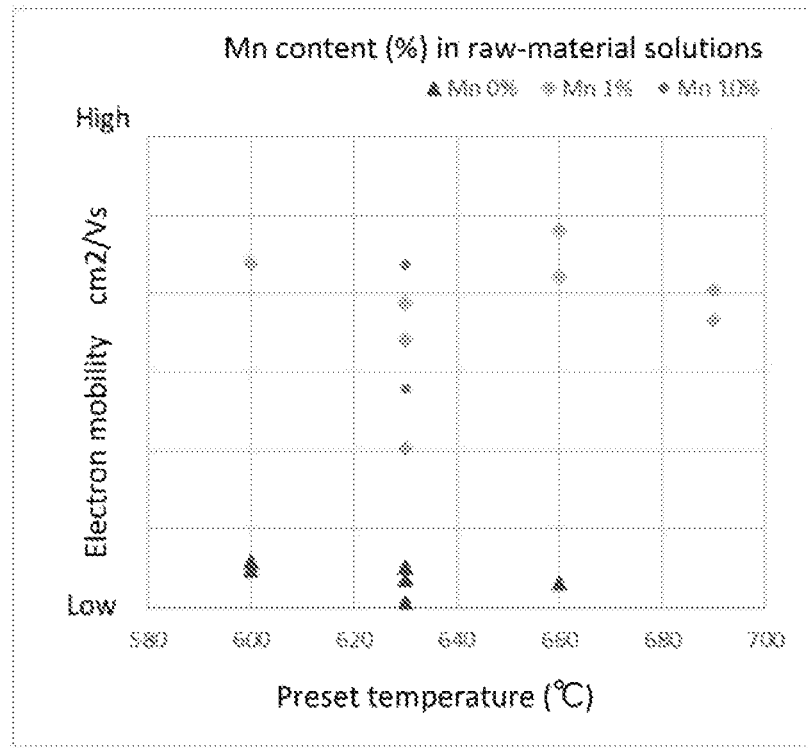
FIG. 8 is a graph showing relations between Mn content (%) of raw-material solutions and electron mobilities of crystalline oxide semiconductors that were obtained from the raw-material solutions in embodiments.
Figure 9:
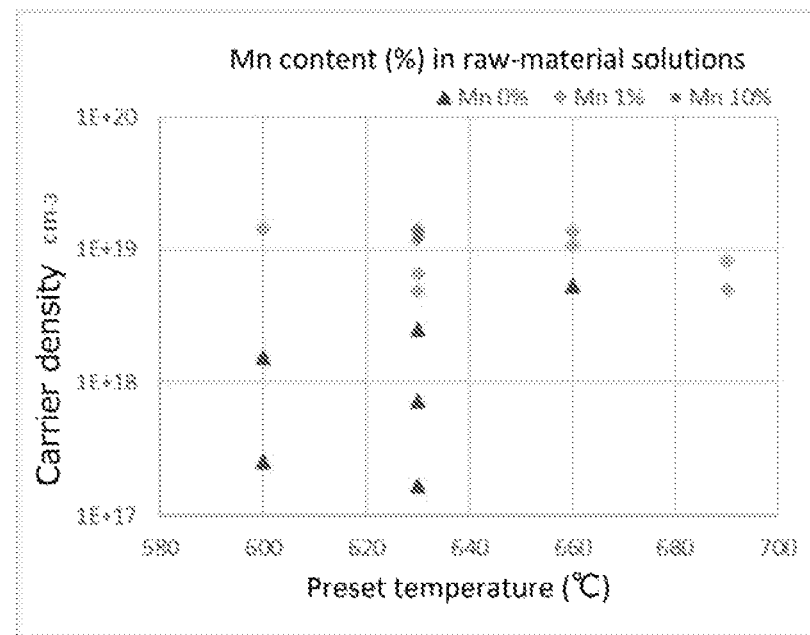
FIG. 9 is a graph showing relations between Mn content (%) in raw-material solutions and carrier densities of crystalline oxide semiconductors that were obtained from the raw-material solutions in embodiments.

Using the same film (layer)-formation apparatus in Practical Example 1, crystalline oxide semiconductors having corundum structures were obtained under following respective conditions: gallium bromide (0.1 mol) and manganese chloride (that was set to be Mn 0% as a Comparative Example, set to be Mn 1%, and set to be Mn 10%, with respect to a mol ratio of Ga atoms) were mixed in water, and the preset substrate temperature was set to be 600° C., 630° C., 660° C., and 690° C., and using germanium as a dopant. The results are shown in FIG. 8 and FIG. 9. Compared with crystalline oxide semiconductors without containing Mn (Mn 0%), it is found that in crystalline oxide semiconductors containing Mn, electron mobility and electrical properties were enhanced. It is noted that manganese chloride 0% with respect to the mol ratio of Ga atoms is shown as Mn 0%, manganese chloride 1% with respect to the mol ratio of Ga atoms is shown as Mn 1%, and manganese chloride 10% with respect to the mol ratio of Ga atoms is shown as Mn 10%. Also, the horizontal axis of FIG. 8 shows the preset temperature (° C.) of the substrate for film formation, and the vertical axis indicates electron mobility ($cm^2/Vs$). Also, as shown in FIG. 9, compared with crystalline oxide semiconductor without containing Mn (Mn 0%), crystalline oxide semiconductors containing Mn also had higher carrier density. In addition, when corundum-structured crystalline oxide semiconductors containing tin as a dopant were similarly obtained, the corundum-structured crystalline oxide semiconductors that contain Mn were found to have enhanced electrical properties (such as electron mobility and carrier density), similarly to the Practical Examples 4 to 14.

Figure 10:
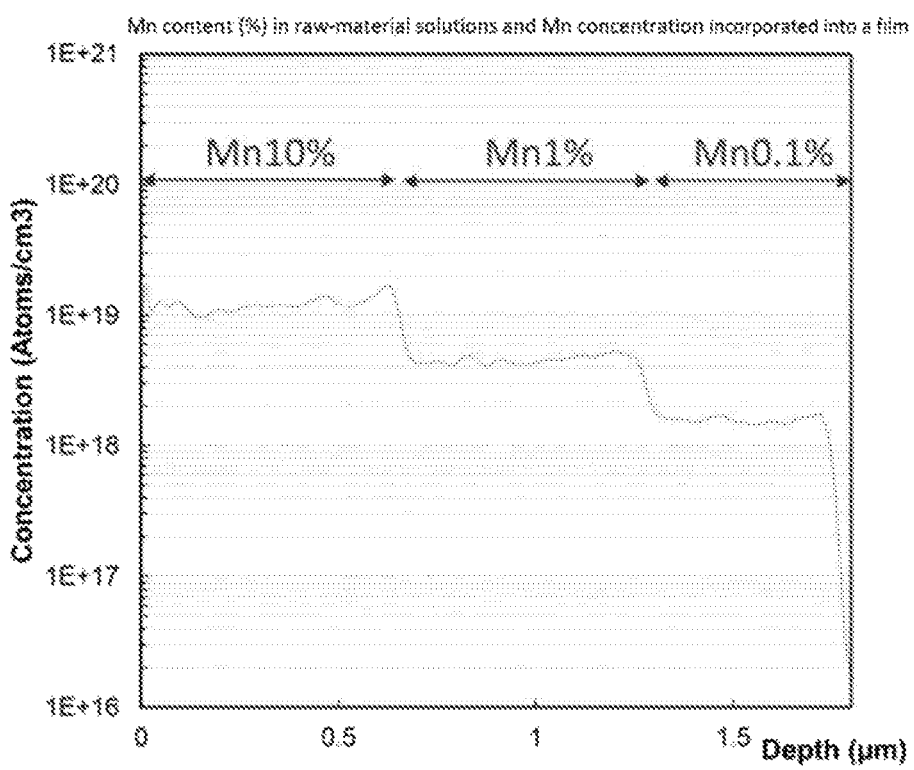
FIG. 10 is Secondary Ion Mass Spectrometry (SIMS) data showing a relation between Mn concentration that was incorporated in a crystalline oxide semiconductor during crystal growth of the crystalline oxide semiconductor while Mn content (%) in raw-material solution(s) was changed.

FIG. 10 shows a SIMS data, showing that a crystal was grown to be a crystalline oxide semiconductor, while Mn content (%) in raw-material solutions was changed, and showing the relationships of the Mn content (%) that was changed in the raw material solutions and Mn concentration ($Atoms/cm^3$) incorporated in the crystalline oxide semiconductor. In the embodiment, Mn content in the crystalline oxide semiconductor was less than the content of the dopant. Also, in embodiments of the present invention, it is preferable that the content of Mn in the crystalline oxide semiconductor is less than the content of the dopant.

INDUSTRIAL APPLICABILITY

Crystals, crystalline oxide semiconductors according to embodiments of the present invention are useful for semiconductor elements and thermistor elements, can be used in high-power semiconductor devices and also used for temperature sensors and gas sensors for temperature compensation of electronic devices, and furthermore used for various systems including semiconductor devices. The temperature sensors and gas sensors are also useful for systems provided with electronic products or electronics.

REFERENCE NUMBER DESCRIPTION 1a a first semiconductor region
1b a second semiconductor region
2 a crystalline oxide semiconductor
2a an inversion channel region
2b an oxide film
2c a second surface of the crystalline oxide semiconductor
3 a metal oxide film
4a an insulation layer
4b an insulation layer
5a a third electrode
5b a first electrode
5c a second electrode
6 a third semiconductor region
9 a substrate
10 a semiconductor device
11a a first electrode
11b a second electrode
12 a semiconductor device
13 a semiconductor device
14 a barrier height adjustment region
15 a trench
15a a bottom of the trench
15b a side wall of the trench
19 a film (layer)-formation apparatus
22a a carrier gas supply device
22b a carrier gas (dilution) supply device
23a a flow control valve
23b a flow control valve
24 a mist generator
24a a raw-material solution
25 a vessel
25a water
26 an ultrasonic transducer
27a a supply tube
27b a film-formation chamber
28 a hot plate
30 a power generation system
31 a water storage tank
32 a fuel cell system
33 a fuel cell processor
34 a fuel cell stack
35 an inverter
36 a controller
37 a fan
38 a heat exchanger
39 a distribution switch board
40 a load
41 a sensor
50 a thermistor film
51 a first electrode
52 a second electrode
70 a circuit substrate
100 a thermistor element
200 a thermistor element
300 a thermistor element
400 a thermistor element
500 a thermistor element
5000 a thermistor film

What is claimed is:

1. A crystal comprising:
a metal oxide comprising Ga and Mn, and having a corundum structure.

2. The crystal according to claim 1, wherein content of Ga in metal components of the metal oxide having the corundum structure is 30 atomic % or more.

3. The crystal according to claim 1, further comprising:
a dopant.

4. A crystalline oxide semiconductor comprising:
Ga and Mn, and having a corundum structure.

5. The crystalline oxide semiconductor according to claim 4, wherein content of Ga in metal components of the crystalline oxide semiconductor having the corundum structure is 30 atomic % or more.

6. The crystalline oxide semiconductor according to claim 4, further comprising:
a dopant.

7. The crystalline oxide semiconductor according to claim 6, wherein content of Mn in the crystalline oxide semiconductor is less than content of the dopant.

8. The crystalline oxide semiconductor according to claim 6, further comprising:
a carrier density that is $1\times10^{15}/cm^3$ to $1\times10^{22}/cm^3$.

9. The crystalline oxide semiconductor according to claim 6, further comprising:
a carrier density that is $1.0\times10^{18}/cm^3$ to $1.0\times10^{22}/cm^3$.

10. The crystalline oxide semiconductor according to claim 4, wherein the crystalline oxide semiconductor has a film shape.

11. The crystalline oxide semiconductor according to claim 10, further comprising:
an m-plane as a principal plane.

12. A semiconductor device comprising:
a crystalline oxide semiconductor film, the crystal oxide semiconductor film comprising the crystal according to claim 1.

13. The semiconductor device according to claim 12, further comprising:
a first electrode arranged at a first surface of the crystalline oxide semiconductor film; and
a second electrode arranged at the first surface of the crystalline oxide semiconductor film,
the first electrode being spaced from the second electrode.

14. The semiconductor device according to claim 12, further comprising:
a first electrode arranged at a first surface of the crystalline oxide semiconductor film; and
a second electrode arranged at a second surface of the crystalline oxide semiconductor film,
the second surface being positioned at an opposite side of the first surface.

15. The semiconductor device according to claim 12, wherein the semiconductor device is one selected from a diode, a transistor, and a thermistor.

16. The semiconductor device according to claim 13, wherein the semiconductor device is a MOSFET.

17. The semiconductor device according to claim 12, wherein the semiconductor device is a power device.

18. A semiconductor system comprising:
the semiconductor device according to claim 12.

19. A semiconductor device comprising:
a crystalline oxide semiconductor film, the crystal oxide semiconductor film comprising the crystalline oxide semiconductor according to claim 4.

20. The semiconductor device according to claim 19, further comprising:
a first electrode arranged at a first surface of the crystalline oxide semiconductor film; and
a second electrode arranged at the first surface of the crystalline oxide semiconductor film,
the first electrode being spaced from the second electrode.

21. The semiconductor device according to claim 19, further comprising:
a first electrode arranged at a first surface of the crystalline oxide semiconductor film; and
a second electrode arranged at a second surface of the crystalline oxide semiconductor film,
the second surface being positioned at an opposite side of the first surface.

* * * * *